United States Patent [19]
Hata et al.

[11] Patent Number: 5,747,828
[45] Date of Patent: May 5, 1998

[54] SEMICONDUCTOR DEVICE WITH INCREASED DISTANCE BETWEEN CHANNEL EDGES AND A GATE ELECTRODE

[75] Inventors: Akihiro Hata; Takashi Funai, both of Tenri; Masahiro Adachi, Nara, all of Japan

[73] Assignee: Sharp Kabushiki Kaisha, Osaka, Japan

[21] Appl. No.: 623,559

[22] Filed: Mar. 28, 1996

[30] Foreign Application Priority Data

Mar. 30, 1995 [JP] Japan .................... 7-074135

[51] Int. Cl.⁶ ............................................... H01L 29/76
[52] U.S. Cl. ........................ 257/66; 257/72; 257/347; 257/354; 257/356; 257/401; 257/773
[58] Field of Search ........................ 257/354, 72, 66, 257/347, 356, 401, 773

[56] References Cited

U.S. PATENT DOCUMENTS

| | | | |
|---|---|---|---|
| 4,242,156 | 12/1980 | Peel | 257/354 |
| 4,822,751 | 4/1989 | Ishizu et al. | 257/70 |
| 5,128,733 | 7/1992 | Tyson | 257/354 |
| 5,130,264 | 7/1992 | Troxell et al. | 257/72 |
| 5,419,876 | 5/1995 | Usui et al. | |
| 5,561,075 | 10/1996 | Nakazawa | 257/72 |
| 5,567,967 | 10/1996 | Kusumoto | 257/52 |
| 5,569,935 | 10/1996 | Takemura et al. | 257/354 |

FOREIGN PATENT DOCUMENTS

| | | | |
|---|---|---|---|
| 60-81869 | 5/1985 | Japan | 257/72 |
| 1-65875 | 3/1989 | Japan | 257/354 |

Primary Examiner—Edward Wojciechowicz
Attorney, Agent, or Firm—Nixon & Vanderhye P.C.

[57] ABSTRACT

The semiconductor device of this invention includes a substrate having an insulating surface and a thin film transistor formed on the substrate, wherein the thin film transistor has a semiconductor island including a channel region and source/drain regions, a gate insulating film formed on the semiconductor island and a gate electrode covering the channel region of the semiconductor island interposing the gate insulating film therebetween, and wherein a distance between an edge of the channel region of the semiconductor island and the gate electrode is larger then a distance between a central portion of the channel region of the semiconductor island and the gate electrode.

7 Claims, 20 Drawing Sheets

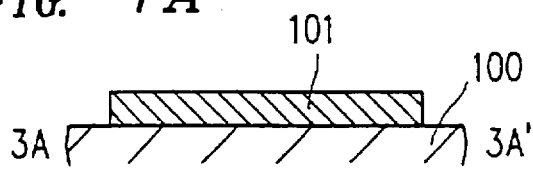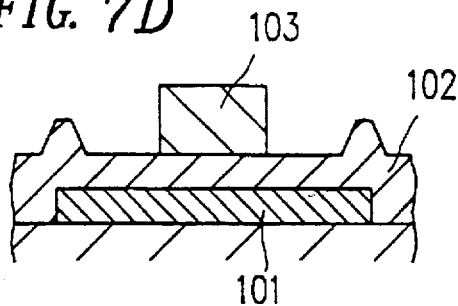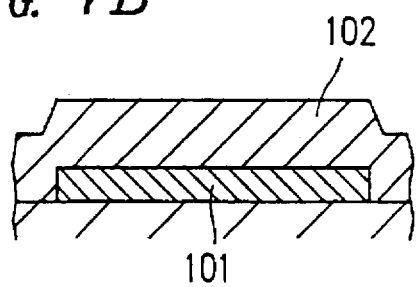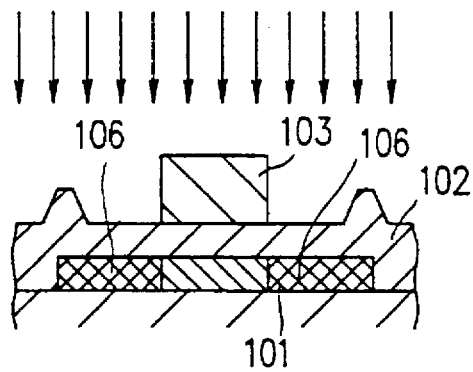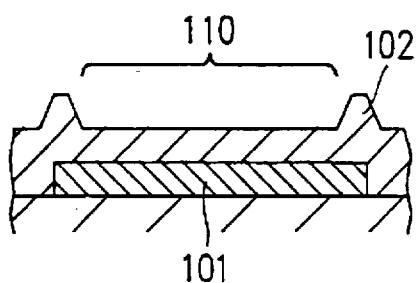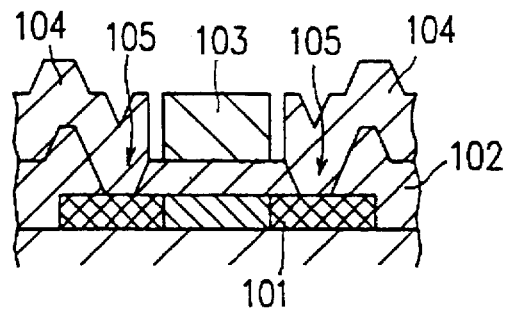

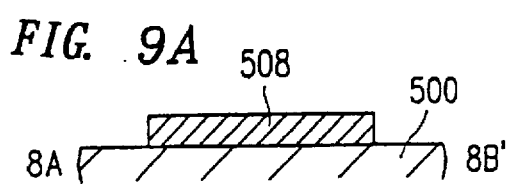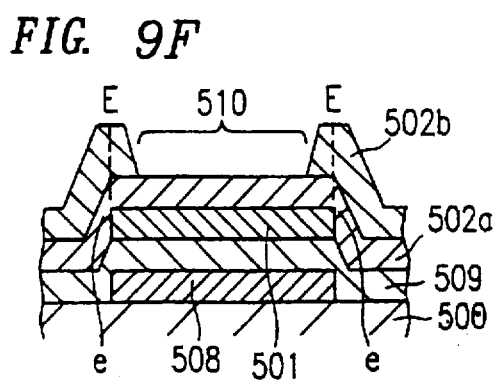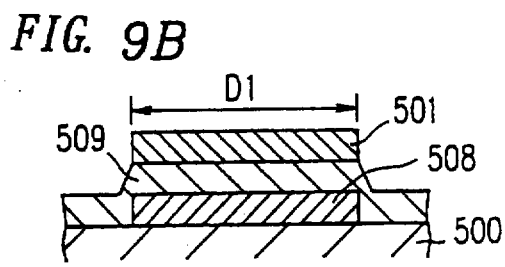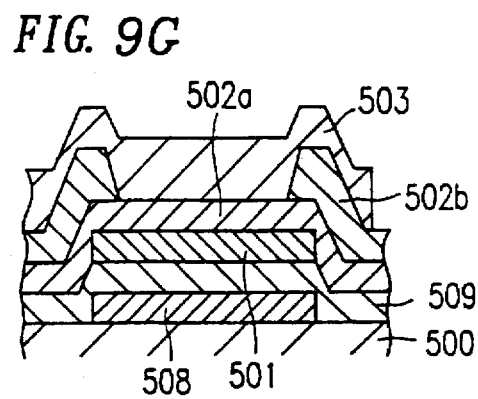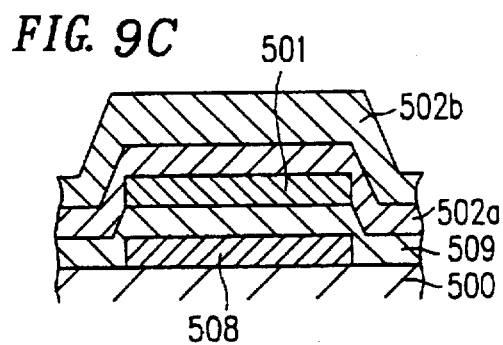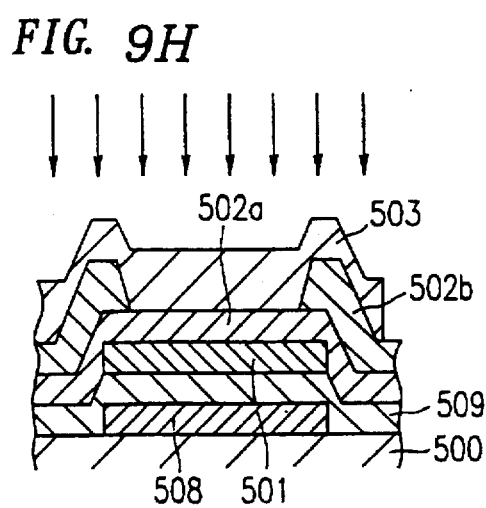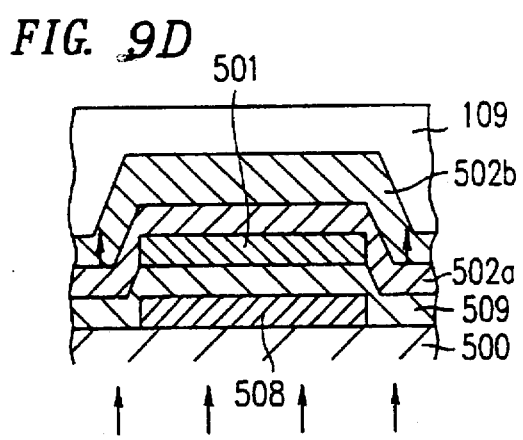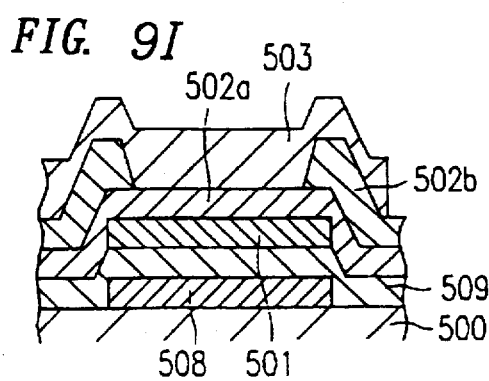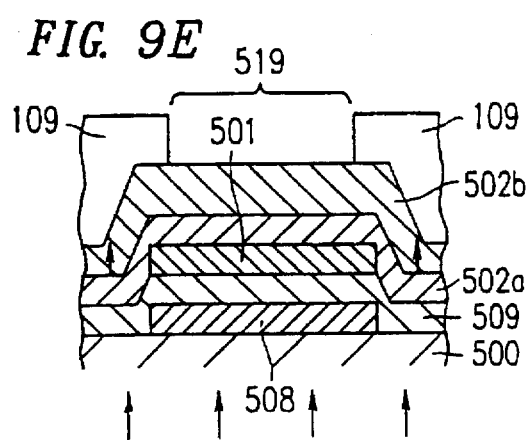

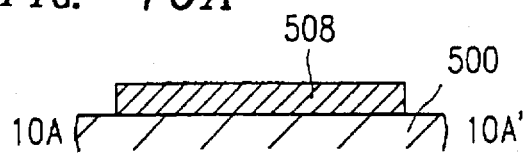
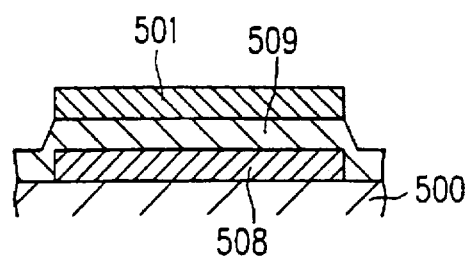
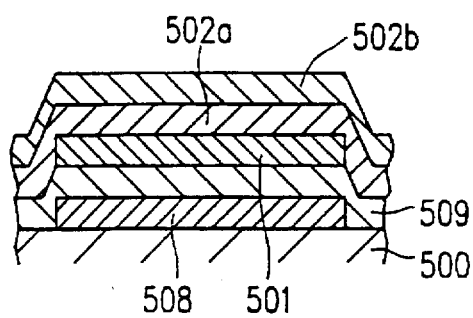
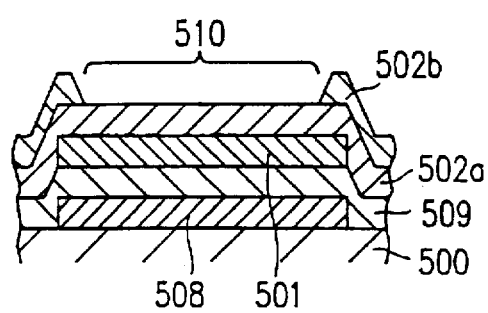
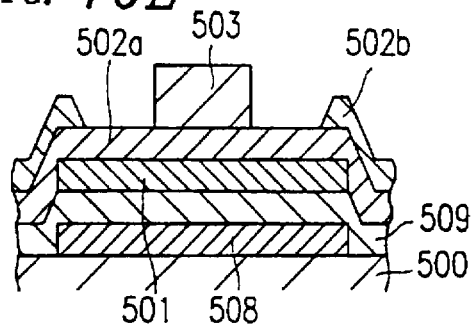
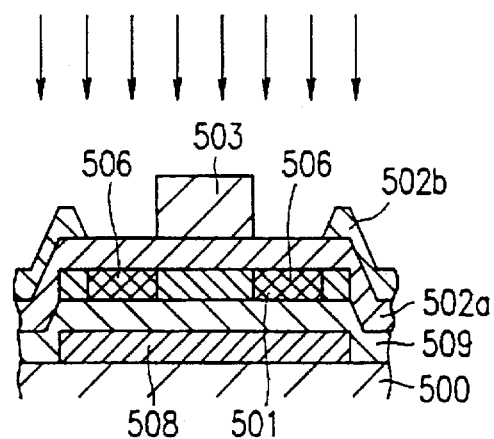
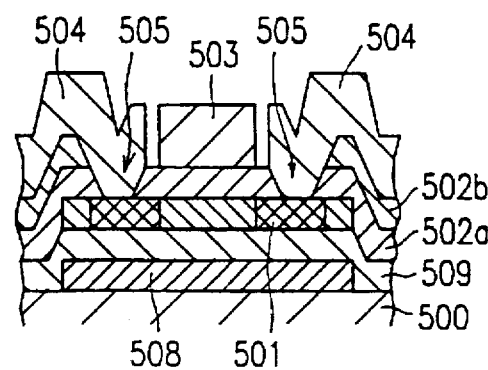

SEMICONDUCTOR DEVICE WITH INCREASED DISTANCE BETWEEN CHANNEL EDGES AND A GATE ELECTRODE

BACKGROUND OF THE INVENTION

1. Field of the Invention

The present invention relates to a semiconductor device using a thin film transistor (TFT) provided on an insulating substrate such as a glass substrate, and a method for fabricating the same. In particular, the present invention relates to a semiconductor device which can be used for an active-matrix liquid crystal display apparatus and a method for fabricating the same.

2. Description of the Related Art

Active-matrix liquid crystal display apparatuses and image sensors using TFTs for driving their pixels are typical semiconductor apparatuses having TFTs formed on a glass substrate or other insulating substrate. Generally, the TFTs used in these apparatuses are formed from thin-film silicon semiconductors.

Such thin-film silicon semiconductors are roughly classified into two types: amorphous silicon (a—Si) semiconductors and crystalline silicon semiconductors.

Of these two types, the amorphous silicon semiconductor is preferred and enjoys general use because it has a low processing temperature and is easily manufactured using a vapor deposition method, thus lending itself to mass production. Compared to the crystalline silicon semiconductor, however, the amorphous silicon semiconductor is inferior in properties such as electrical conductivity. It is therefore strongly desired to establish an efficient fabrication method for TFTs formed from the crystalline silicon semiconductors to achieve faster response characteristics of the semiconductor devices fabricated from them.

The crystalline silicon semiconductors currently known include polycrystalline silicon, microcrystalline silicon, amorphous silicon containing crystalline components, semi-amorphous silicon having an intermediate state between crystalline and amorphous forms, etc. In general, each of the TFTS formed from these crystalline silicon semiconductors has a layered structure in which a substrate, an island-shaped semiconductor layer, a gate insulating film and a gate electrode traversing the island semiconductor layer are formed in this order (i.e., top gate type structure).

FIG. 18A is a plan view showing a conventional TFT made from the crystalline silicon semiconductor, and FIG. 18B is a cross-sectional view taken along a line 18B-18B' in FIG. 18A. FIGS. 19A through 19D are cross-sectional views showing a fabrication process of the TFT taken along the line 18B-18B' in FIG. 18A. FIGS. 20A through 20D are cross-sectional views showing the fabrication process of the TFT taken along a line 20A-20A' in FIG. 18A. This conventional TFT is fabricated as follows.

First, a film made of $SiO_2$ or $SiN_x$ is deposited on an insulating substrate 1100, such as a glass substrate, to an appropriate thickness by sputtering or the like. A semiconductor silicon film is formed on the film to a thickness of about 100 nm by a CVD method or the like.

Subsequently, a thermal treatment process such as a heat treatment at about 600° C. in a furnace or excimer laser irradiation is performed so as to crystallize the semiconductor silicon film. Thereafter, the semiconductor silicon film is patterned into a rectangular island shape. Alternatively, the patterning process can be conducted prior to the thermal treatment process. Specifically, the semiconductor silicon film is patterned into a rectangular island shape. Thereafter, the thermal treatment process such as a heat treatment at about 600° C. in a furnace or excimer laser irradiation is performed so as to crystallize the island-shaped semiconductor silicon film. In this way, a crystalline semiconductor island 1101 shown in FIGS. 19A and 20A is obtained.

Next, as shown in FIGS. 19B and 20B, a gate insulating film 1102 is formed on the entire surface of the substrate 1100 by sputtering or a CVD method so as to cover the crystalline semiconductor island 1101. A thickness of the gate insulating film 1102 is about 100 nm. The gate insulating film 1102 is made of $SiO_2$ or $SiN_x$. Subsequently, a gate electrode 1103 is formed so as to traverse the rectangular crystalline semiconductor island 1101. The gate electrode 1103 is made of a conductive material.

Next, as shown in FIGS. 19C and FIG. 20C, a region of the crystalline silicon island 1101, on which the gate electrode 1103 is not formed, is doped with donor ions or acceptor ions using the gate electrode 1103 as a mask. This doping process can be conducted in the presence of the gate insulating film 1102 or after removing the region of the gate insulating film 1102 on which the gate electrode 1103 is not formed by etching. By doping part of the crystalline silicon island 1101 with donor ions or acceptor ions, source/drain regions 1106 are formed in the crystalline semiconductor island 1101.

Then, as shown in FIG. 20D, the source/drain regions 1106 of the crystalline semiconductor island 1101 are partially exposed. Subsequently, source/drain electrodes 1104 are formed so as to cover the exposed parts without being in contact with the gate electrode 1103, thereby completing the TFT. It has been reported in the recent result of the research that the thus fabricated TFT has a mobility of 100 $cm^2/V \cdot s$ or higher.

In order to apply TFTs to a liquid crystal display apparatus, there are two main problems to be solved: reduction in an OFF current across a TFT and improvement in reliability.

Due to its structure, the thus fabricated TFT has a disadvantage in that a thickness of part of the gate insulating film 1102 covering the side faces of edges of the crystalline semiconductor island 1101 is smaller than that on the upper surface of the crystalline semiconductor island 1101. This can be seen as a portion P marked with a double dashed line in FIG. 18B. Otherwise, the edges of the crystalline semiconductor island 1101 cannot be covered with the gate insulating film 1102.

The inventors of the present invention carried out an experiment using tetraethoxysilane (TEOS) which is recognized as having high step coverage performance. As a result, it was confirmed that a thickness of part of the gate insulating film covering the side faces of the edge of the crystalline semiconductor island is about 60% of that formed on the upper surface of the crystalline semiconductor island.

An electric field in the gate insulating film 1102 having a small thickness is higher than an average electric field in the gate insulating film 1102 positioned on the upper surface of the crystalline semiconductor island 1101. As a result, electric breakdown inevitably occurs in the regions having a little thickness. Furthermore, various problems such as failures and deterioration of performance in TFTs are caused by a phenomenon generally called "hot electron effect". This hot electron effect further induces other phenomena related to the electric field strength such as implantation of unnecessary electric charges into an insulator.

A measure to counter the deterioration of TFT characteristics resulting from a small thickness of part of the gate insulating film covering the side faces of the edges of the above-mentioned crystalline semiconductor island is proposed in Japanese Laid-Open Patent Publication No. 6-37317 corresponding U.S. Pat. No. 5,130,264. In Japanese Laid-Open Patent Publication No. 6-37317, an insulating film is formed by oxidizing the periphery of a region serving as a TFT in the semiconductor silicon film after the semiconductor film is formed. As a result, the crystalline semiconductor island is formed so as to be buried in a silicon oxide wall to uniformize the thickness of the gate insulating film. In this way, the above-mentioned problem resulting from the small thickness of part of the gate insulating film is solved.

As a method for oxidizing the silicon film, high-temperature vapor oxidation at about 800° C. and low-temperature plasma oxidation at about 600° C. have been proposed. This high-temperature vapor oxidation method seems to be extremely effective in fabricating a crystalline silicon TFT in which a maximum temperature exceeding 800° C. is used or in fabricating a single-crystalline silicon TFT. In view of application of TFTs to a liquid crystal display apparatus, it is necessary to use a glass substrate to achieve a large display size and reduction of the fabrication cost. However, the above-mentioned thermal oxidation process cannot be applied because of low heat-resistance of the glass substrate.

As a measure to counter this problem of heat-resistance, Japanese Laid-Open Patent Publication No. 6-37317 has proposed a plasma anodizing technique at a temperature in the range of 500° C. to 600° C. Generally, in a crystalline silicon film which is formed by a low-temperature process having the maximum temperature of about 600° C., crystal grains having a diameter in the order of μm or less are distributed. Each crystal grain has a twin structure in which crystals having various crystal orientations are distributed in a branch-like manner. A number of lattice defects are present in one crystal grain as well as in the boundary regions of crystal grains.

As a method for examining the condition of the crystal growth of a crystalline silicon film, a method called secco etching is generally known. The secco etching utilizes the principle that silicon in the boundary regions of crystal grains is more rapidly oxidized and etched as compared with silicon in crystal grains if a surface of a crystalline silicon film is etched under the appropriate condition using an etchant having the oxidation function, By this method, the size of a crystal grain can be easily observed using an optical microscope.

As is apparent from this principle of secco etching, if an oxidation process is conducted on the crystalline silicon film as described in Japanese Laid-Open Patent Publication No. 6-37317, unevenness occurs on the interface between the semiconductor silicon island and the $SiO_2$ wall. The unevenness of the interface results in concentration of electric charges and reduction of the mobility of TFTs. In particular, the characteristics of TFT having a mobility of 100 $cm^2$/V·s or higher may be significantly deteriorated. Thus, the method described in Japanese Laid-Open Patent Publication No. 6-37317 is not considered to be effective for mass production.

The inventors of the present invention examined an OFF current using a TFT having the structure shown in the conventional example. As a result, it became apparent that a width of a channel of TFT and the minimum value of an OFF current have a linear relationship, and thus an OFF current of about 1 to 2 pA flows even if a channel width is assumed to be zero according to the calculation. The reason why this phenomenon occurs is considered to be because a leakage current in the vicinity of the edges of the crystalline semiconductor island becomes larger than that in the other portion due to the concentration of the electric field in the vicinity of the edge of the crystalline semiconductor island. The TFTs cannot be applied to a liquid crystal display apparatus unless these problems are solved.

SUMMARY OF THE INVENTION

The semiconductor device of this invention includes a substrate having an insulating surface and a thin film transistor formed on the substrate, wherein the thin film transistor has a semiconductor island including a channel region and source/drain regions, a gate insulating film formed on the semiconductor island and a gate electrode covering the channel region of the semiconductor island interposing the gate insulating film therebetween, and wherein a distance between an edge of the channel region of the semiconductor island and the gate electrode is larger than a distance between a central portion of the channel region of the semiconductor island and the gate electrode.

In one embodiment of the present invention, the substrate is a light transmitting substrate, and the semiconductor device further comprises a light shielding film for preventing light incident on a bottom face of the light transmitting substrate from passing therethrough to reach the semiconductor island.

In another embodiment of the present invention, the light shielding film is placed between the semiconductor island and the light transmitting substrate.

In still another embodiment of the present invention, the light shielding film has a shape identical with that of the semiconductor island, and is formed within a region defined by vertically projecting the semiconductor island onto a surface of the light transmitting substrate.

In still another embodiment of the present invention, the light shielding film has a shape identical with that of the channel region of the semiconductor island, and is formed within a region defined by vertically projecting the channel region onto a surface of the light transmitting substrate.

In still another embodiment of the present invention, the gate insulating film includes a plurality of insulating layers.

In still another embodiment of the present invention, the gate insulating film includes a plurality of insulating layers.

According to another aspect of the present invention, a method for fabricating a semiconductor device including a substrate having an insulating surface and a thin film transistor formed on the substrate, includes the steps of: forming a semiconductor island on the substrate; forming a gate insulating film covering the semiconductor island and having a concave portion on a portion serving as a channel region of the semiconductor island; and forming a gate electrode covering the portion serving as the channel region of the semiconductor island on the gate insulating film, wherein the concave portion of the gate insulating film is formed inside positions of edges defined by vertically projecting edges of the semiconductor island onto a surface of the gate insulating film in a direction perpendicular to a surface of the substrate.

In one embodiment of the present invention, the step of forming the gate insulating film having the concave portion includes the steps of: forming a first insulating layer on the semiconductor island so as to cover the semiconductor island; forming a mask for lift off on the first insulating layer; forming a second insulating layer covering the mask; and removing the mask and the second insulating layer on the mask by lift off.

In another embodiment of the present invention, a thickness of the second insulating layer is smaller than a thickness of the mask.

In still another embodiment of the present invention, a thickness of the second insulating layer is larger then a thickness of the first insulating layer.

In still another embodiment of the present invention, the step of forming the gate insulating film having the concave portion includes the steps of: forming a first insulating layer on the semiconductor island so as to cover the semiconductor island; forming a second insulating layer covering the first insulating layer; and forming the concave portion of the gate insulating film by selectively etching part of the second insulating layer including a portion positioned above a region of the semiconductor island serving as the channel region.

In still another embodiment of the present invention, an etching rate of the second insulating layer differs from an etching rate of the first insulating layer.

According to still another aspect of the present invention, a method for fabricating a semiconductor device including a light transmitting substrate and a thin film transistor formed on the light transmitting substrate, includes the steps of: forming an island-shaped light shielding film on a surface of the light transmitting substrate or in the light transmitting substrate; forming a semiconductor island opposed to the light shielding film; forming a gate insulating film covering the semiconductor island and having a concave portion on a portion of the semiconductor island serving as a channel region; and forming a gate electrode covering the portion of the semiconductor island serving as the channel region on the gate insulating film, wherein the concave portion of the gate insulating film is formed inside positions of edges defined by vertically projecting edges of the semiconductor island onto a surface of the gate insulating film in a direction perpendicular to a surface of the substrate.

In one embodiment of the present invention, the light shielding film is formed between the semiconductor island and the light transmitting substrate.

In another embodiment of the present invention, the light shielding film is formed so as to have a shape identical with that of the semiconductor island and to be positioned within a region defined by projecting the semiconductor island onto the surface of the light transmitting substrate in a direction perpendicular to the surface of the light.

In still another embodiment of the present invention, the light shielding film is formed so as to have a shape identical with that of the region of the semiconductor island serving as the channel region and to be positioned within a region defined by projecting the region of the semiconductor island serving as the channel region onto the surface of the light transmitting substrate in a direction perpendicular to the surface of the light.

In still another embodiment of the present invention, the step of forming the semiconductor island includes the steps of: forming a semiconductor film on the light shielding film; forming a photoresist film on the semiconductor film; forming a resist island by exposing the photoresist film to light from a bottom face of the light transmitting substrate using the light shielding film as a mask; and forming the semiconductor island having a shape identical with that of the light shielding film by selectively etching the semiconductor film.

In still another embodiment of the present invention, the step of forming the gate insulating film having the concave portion includes the steps of: forming an insulating film on the semiconductor island; forming a negative photoresist film on the insulating film; forming an opening through the negative photoresist film by exposing the negative photoresist film to light from a bottom face of the light transmitting substrate using the light shielding film as a mask, and forming the concave portion of the gate insulating film having a shape substantially identical with that of the light shielding film by etching an upper part of the insulating film, which is exposed through the opening of the negative photoresist film.

In still another embodiment of the present invention, the step of forming the gate insulating film having the concave portion includes the steps of: forming an insulating film on the semiconductor island; forming a negative photoresist film on the insulating film; forming an opening through the negative photoresist film by exposing the photoresist film to light from a bottom face of the light transmitting substrate using the light shielding film as a mask; and forming the concave portion of the gate insulating film having a shape substantially identical with that of the light shielding film by etching an upper part of the insulating film, which is exposed through the opening of the negative photoresist film.

In still another embodiment of the present invention, the step of forming the gate insulating film having the concave portion includes the steps of: forming a first insulating layer on the semiconductor island and so as to cover the semiconductor island; forming a second insulating layer so as to cover the first insulating layer; and forming the concave portion of the gate insulating film by selectively etching part of the second insulating layer including a portion positioned on the region serving ea the channel region of the semiconductor island.

In still another embodiment of the present invention, an etching rate of the first insulating layer differs from an etching rate of the second insulating layer.

Thus, the invention described herein makes possible the advantages of: (1) providing a semiconductor device capable of preventing an increase in an OFF current and the concentration of the electric field which may deteriorate the TFT characteristics; and (2) providing a method for fabricating such a semiconductor device.

These and other advantages of the present invention will become apparent to those skilled in the art upon reading and understanding the following detailed description with reference to the accompanying figures.

BRIEF DESCRIPTION OF THE DRAWINGS

FIGS. 7A through 7F are cross-sectional views showing a fabrication process of the TFT according to Example 3, taken along the line 3A-3A' (dashed line) in FIG. 1A.

FIG. 9A through 9I are cross-sectional views showing a fabrication process of the TFT according to Example 4 of the present invention, taken along the line 8B-8B' (dashed line) in FIG. 8A.

FIGS. 10A through 10G are cross-sectional views showing the fabrication process of the TFT according to Example 4, taken along a line 10A-10A' (dashed line) in FIG. 8A.

DESCRIPTION OF THE PREFERRED EMBODIMENTS

Hereinafter, the present invention will be described by way of illustrative examples.

First, the mechanism of a leakage current in edges of a semiconductor island will be described. In the case where a gate insulating film consists of a single layer as described in the conventional example, part of the gate insulating film formed in the vicinity of the edges of the semiconductor island is thinner than that formed on the central part of the semiconductor island. The gate electrode in the vicinity of the edges of the semiconductor island is formed on the gate insulating film so as to cover the side faces on the steps of the edges. Therefore, an electric field in the gate insulating film in the vicinity of the edges of the semiconductor island becomes extremely high as compared with that in the gate insulating film on the semiconductor island. As a result, these structural problems of the TFT produce disadvantages such as an increase in an OFF current or deterioration of TFT characteristics.

In the present invention, part of the gate insulating film in the vicinity of edges of the semiconductor island is formed to be thicker than that on the semiconductor island. In other words, a distance between each of the edges of the semiconductor island and the gate electrode is made larger than that between the central part of the semiconductor island and the gate electrode. By this configuration, it becomes possible to avoid the increase in the OFF current and the concentration of an electric field which may result in deterioration of the characteristics of TFT. Therefore, a TFT having excellent characteristics can be fabricated.

Moreover, in the present invention, an insulating film is deposited on a semiconductor film which is previously patterned into an island shape instead of oxidizing the entire semiconductor film as described in Japanese Laid-Open Patent Publication No. 6-37317. By this process, the unevenness is prevented from being formed on the edges of a semiconductor island. As a result, crystalline silicon TFTs can be mass-produced using glass substrates.

Hereinafter, examples of the present invention will be specifically described with reference to drawings.

EXAMPLE 1

Figure 1A:
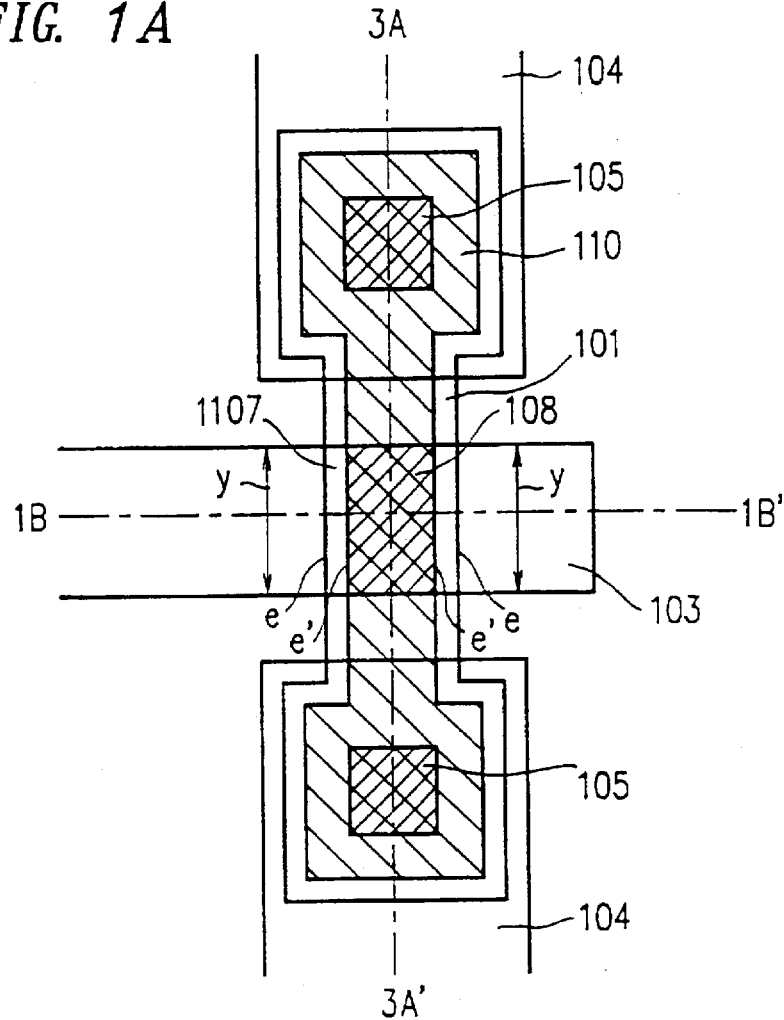
FIG. 1A is a plan view showing a TFT according to Example 1 of the present invention.
Figure 1B:
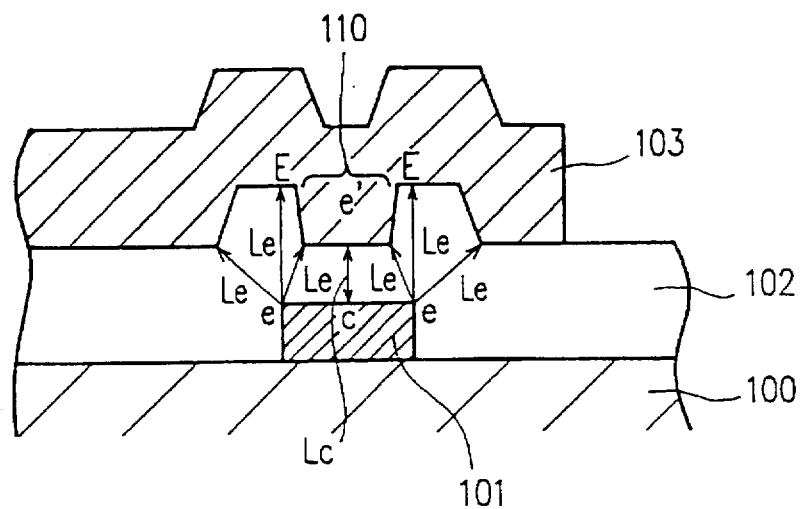
FIG. 1B is a cross-sectional view showing the TFT taken along a line 1B-1B' (dashed line) in a direction perpendicular to a paper face.

FIG. 1A is a plan view showing a TFT according to Example 1, and FIG. 1B is a cross-sectional view of the TFT taken along a dashed line 1B-1B' in FIG. 1A in a direction perpendicular to a paper face. The TFT includes a substrate 100, a semiconductor island 101 formed on the substrate 100 and a gate insulating film 102 formed on the semiconductor island 101 so as to cover the entire substrate 100. The gate insulating film 102 is made of at least one of $SiO_2$, $SiN_x$ and SiON. The gate insulating film 102 can be a single layer or include a plurality of insulating layers. In Examples 1 and 2, the gate insulating film 102 includes a first insulating layer 102a and a second insulating layer 102b.

As shown in FIG. 1A, a gate electrode 103 is formed on the gate insulating film 102 so as to cover a channel region 1107 in the semiconductor island 101. Source/drain regions (not shown) are respectively provided in the regions of the semiconductor island 101 which do not overlap the gate electrode 103. The source/drain regions are connected to source/drain electrodes 104 via contact holes 105 respectively provided in the source/drain regions.

As shown in FIG. 1B, a concave portion 110 is formed on the surface of the gate insulating film 102 formed on the semiconductor island 101. As can be seen from FIGS. 1A and 1B, edges e' of the semiconductor island 101 are positioned inside the edges e of the semiconductor island 101. By this configuration, a distance Le between the edge e of the semiconductor island 101 and the gate electrode 103 is larger than a distance Lc between a central portion c of the semiconductor island 101 and the gate electrode 103 as shown in FIG. 1B. Herein, the distance Le refers to a distance between the edge e of the semiconductor island 101 and any corner of the gate electrode 103, and the distance Lc refers to a distance between the central portion c of the upper surface of the semiconductor island 101 and the gate electrode 103 in a vertical direction.

Although the concave portion 110 of the gate insulating film 102 is formed throughout the entire semiconductor island 101 as shown in FIG. 1A, the present invention is not limited to this. The effect of the present invention can be obtained as long as the concave portion 110 is formed on the surface of the gate insulating film 102 on the channel region 1107 of the semiconductor island 101 and inside the edges E defined by projecting the edges e onto the surface of the gate insulating film 102 in a direction perpendicular to the surface of the substrate 100.

Herein, the edges e of the semiconductor island 101 and the edges e' formed on the surface of the gate insulating film 103 positioned on the channel region 1107 indicate the edges e and e' along the direction indicated with lines y in FIG. 1A, respectively.

By the above configuration, a distance between the edges of the semiconductor island 101 and the gate electrode 103 is greater than that between the central portion of the semiconductor island 101 and the gets electrode 103. Thus, it is possible to avoid the increase in an OFF current and the concentration of the electric field in the edges causing the deterioration of TFT characteristics. As a result, TFTs having excellent characteristics can be obtained.

Next, a fabrication process of the TFT having the configuration as shown in FIGS. 1A and 1B will be described with reference to FIGS. 2A through 2G and FIGS. 3A through 3G.

FIGS. 2A through 2G are cross-sectional views showing the fabrication process of the TFT, taken along a line 1B-1B' (dashed line) in FIG. 1A, and FIGS. 3A to 3G are cross-sectional views showing the fabrication process of the TFT, taken along a line 3A-3A' (dashed line) in FIG. 1A.

Figure 2A:
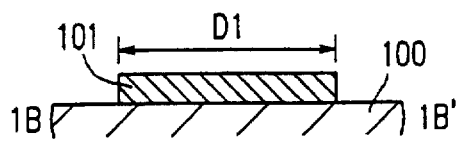
FIGS. 2A through 2G are cross-sectional views showing a fabrication process of the TFT according to Example 1 of the present invention, taken along the line 1B-1B' (dashed line) in FIG. 1A.
Figure 3A:
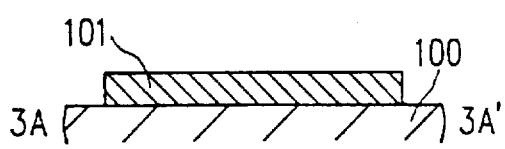
FIGS. 3A through 3G are cross-sectional views showing the fabrication process of the TFT according to Example 1, taken along a line 3A-3A' (dashed line) in FIG. 1A.

On a substrate 100 having an insulating surface or a substrate 100 on which an insulating film made of $SiO_2$ or $SiN_x$ is deposited to a thickness of about 100 nm by using a sputtering apparatus or a CVD apparatus, as shown in FIGS. 2A and 3A, a semiconductor silicon film is deposited to a thickness in the range of 10 nm to 200 nm by the CVD apparatus and the like. If a thickness of the semiconductor silicon film is out of this thickness range, the following problems may occur: when the semiconductor silicon film is too thin, an ON current across the TFT is lowered or sufficient contact cannot be obtained; when the semiconductor silicon film is too thick, an OFF current increases. A preferred thickness of the semiconductor silicon film is in the range of 30 nm to 100 nm.

Subsequently, the semiconductor silicon film is crystallized by annealing the entire substrate at about 600° C. In the case where the substrate 100 is made of a material resistant to a temperature higher than 600° C., e.g., a quartz substrate, annealing temperature can be raised. Moreover, the semiconductor silicon film can be crystallized by irradiating the semiconductor silicon film with a high-energy light beam such as an excimer laser instead of annealing the semiconductor silicon film.

After being crystallized, the semiconductor silicon film is patterned into an island shape so as to obtain a semiconductor island 101. A width D1 of the semiconductor island 101 in 1B-1B' direction is about 5 µm. The semiconductor island 101 can be obtained by forming a resist island on the semiconductor silicon film by photolithography and then etching the semiconductor silicon film by dry etching or the like. Since the etching process does not include a step of oxidizing the semiconductor silicon film, the unevenness generated in a thermal oxidation process is prevented from being formed on the edges of the semiconductor island 101.

Next, a first insulating layer 102a having a thickness of about 100 nm is deposited on the semiconductor island 101 so as to cover the entire substrate 100. The first insulating layer 102a deposited by sputtering or a CVD method. If the first insulating layer 102a is far thicker than 100 nm, an ON voltage hardly generates a sufficient electric field. If the first insulating layer 102a is far thinner then 100 nm, sufficient insulating effect cannot be obtained.

Figure 2B:
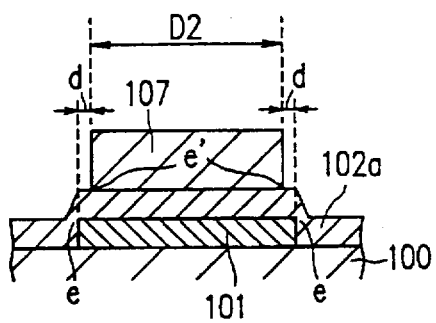
Figure 3B:
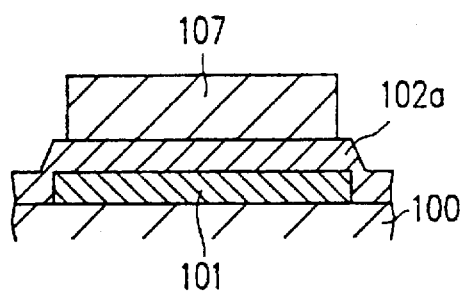

Next, as shown in FIGS. 2B and 3B, a mask 107 for lift off is formed on the first insulating layer 102a. The mask 107 is made of a material which has sufficient heat-resistance in forming a second insulating layer described below and is capable of being easily removed by wet etching and the like, for example, Al. As shown in FIG. 2B, a width D2 of the mask 107 is set to be narrower than a width D1 of the semiconductor island 101. The mask 107 has margins d for alignment of the mask for both edges e of the semiconductor island 101, The margin d is required to be in the range of about 0.1 to 1 µm.

Figure 2C:
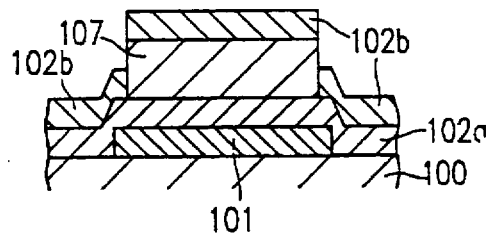
Figure 3C:
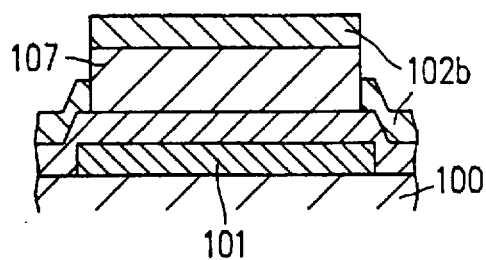

Next, as shown in FIGS. 2C and 3C, a second insulating layer 102b is deposited covering the mask 107 by sputtering or the like. The second insulating layer 102b is formed so as to be thinner than the mask 107 for lift off. Moreover, it is preferable that the second insulating layer 102b is formed so as to be thicker than the first insulating layer 102a. By this thickness, the second insulating layer can be prevented from being disconnected by the difference in level of the edges of the first insulating layer or from being too thin in the vicinity of the edges of the semiconductor island 101.

Figure 2D:
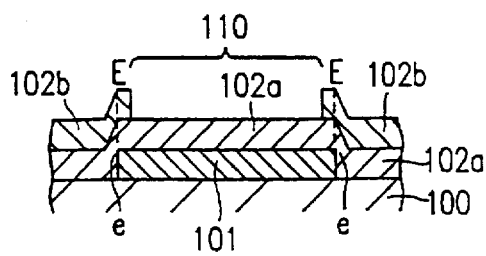
Figure 3D:
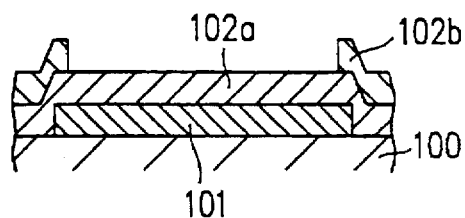

Next, as shown in FIGS. 2D and FIG. 3D, the mask 107 and part of the second insulating layer 102b formed on the mask 107 are lifted off by wet etching. By this wet etching, a concave portion 110 is formed through the second insulating layer 102b formed on the semiconductor island 101. By providing the margins d as shown in FIG. 2B for the semiconductor island 101, the concave portion 110 can be formed inside the positions of the edges E defined by projecting the edges e of the semiconductor island 101 onto the surface of the gate insulating film 102b in a direction perpendicular to the surface of the substrate 100.

Figure 2E:
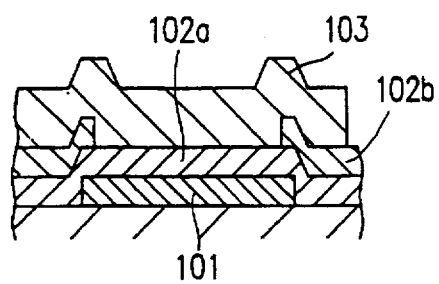
Figure 3E:
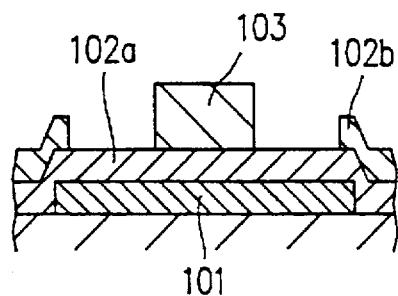

Next, as shown in FIGS. 2E and 3E, a gate electrode 103 is formed on the substrate 100 using a conductive material.

Figure 2F:
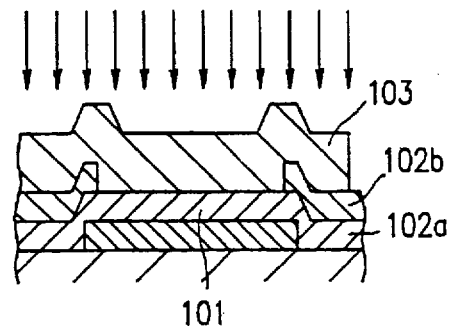
Figure 3F:
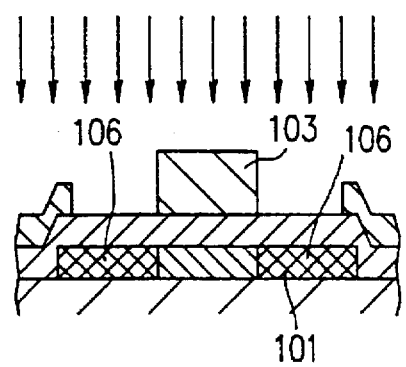

Then, as indicated with arrows in FIGS. 2F and 3F, donor or acceptor ions are implanted into the semiconductor island 101 by ion doping. Thereafter, a process for activating the dopant is conducted. By this process, the regions of the semiconductor island 101 which do not overlap the gate electrode 103 are rendered electrically conductive to form source/drain regions 106 as shown in FIG. 3F. A region of the semiconductor island 101 between the source region 106 and the drain region 106 serves as a channel region.

Figure 2G:
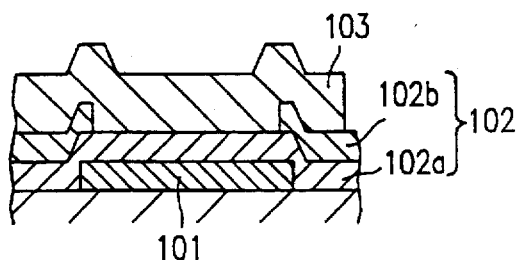
Figure 3G:
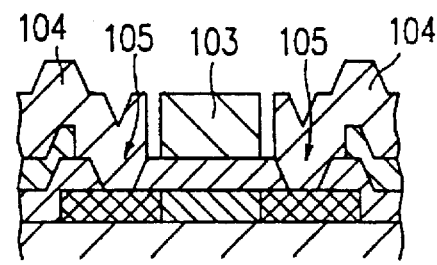

Finally, as shown in FIGS. 2G and 3G, contact holes 105 are formed through the first insulating layer 102a on the source/drain regions 105. Source/drain electrodes 104 are formed on the regions which do not overlap the gate electrodes 103 so as to be electrically conductive with the source/drain regions 106 through the contact holes 105, thereby completing a TFT.

By fabricating the TFT in the above-described manner, the distance Le between each of the edges e of the semiconductor island 101 and the gate electrode 103 can be made greater than the distance Lc between the central portion c of the semiconductor island 101 and the gate electrode 103.

EXAMPLE 2

Another fabrication method of the TFT having the configuration shown in FIGS. 1A and 1B will be described in Example 2.

FIGS. 4A through 4I and FIGS. 5A through 5F are cross-sectional views showing the fabrication process according to Example 2. FIGS. 4A through 4I are cross-sectional views taken along the line 1B-1B' (dashed line) in FIG. 1A, and FIGS. 5A through 5F are cross-sectional views taken along the line 3A-3A' (dashed line) in FIG. 1A.

Figure 4A:
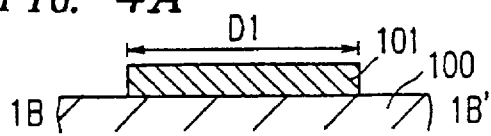
FIGS. 4A through 4I are cross-sectional views showing a fabrication process of the TFT according to Example 2 of the present invention, taken along the line 1B-1B' (dashed line) in FIG. 1A.
Figure 5A:
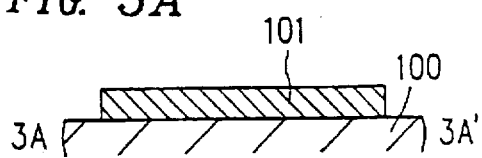
FIGS. 5A through 5F are cross-sectional views showing the fabrication process of the TFT according to Example 2, taken along the line 3A-3A' (dashed line) in FIG. 1A.
Figure 5B:
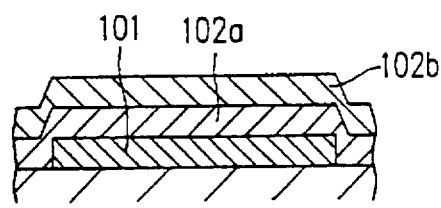

First, on the substrate 100 having an insulating surface or the substrate 100 on which an insulating film made of $SiO_2$ or $SiN_x$ is deposited to a thickness of about 100 nm by using a sputtering apparatus or a CVD apparatus, as shown in FIGS. 4A and 5A, a semiconductor silicon film is deposited to a thickness in the range of 10 nm to 200 nm by the CVD apparatus and the like. If a thickness of the semiconductor silicon film is out of this thickness range, the following problems may occur: when the semiconductor silicon film is too thin, an ON current across a TFT is lowered or the sufficient contact cannot be obtained; when the semiconductor silicon film is too thick, an OFF current increases. A preferred thickness of the semiconductor silicon film is in the range of 30 nm to 100 nm.

Subsequently, the semiconductor silicon film is crystallized by annealing the entire substrate at about 600° C. In the case where the substrate 100 is made of a material sufficiently resistant to a temperature higher than 600° C., e.g., a quartz substrate, an annealing temperature can be raised. Moreover, the semiconductor silicon film may be crystallized by irradiating the semiconductor silicon film with a high-energy light beam such as an excimer laser instead of annealing the semiconductor silicon film.

After crystallizing the semiconductor silicon film, the semiconductor silicon film is patterned into an island shape so as to obtain the semiconductor island 101. A width D1 of the semiconductor island 101 in 1B-1B' direction is about 5 µm. The semiconductor island 101 can be obtained by forming a resist island on the semiconductor silicon film by photolithography and then etching the semiconductor silicon film by dry etching or the like. Since the etching process does not include a step of oxidizing the semiconductor silicon film, the unevenness being generated in a thermal oxidation process is prevented from being formed on the edges of the semiconductor island 101.

Figure 4B:
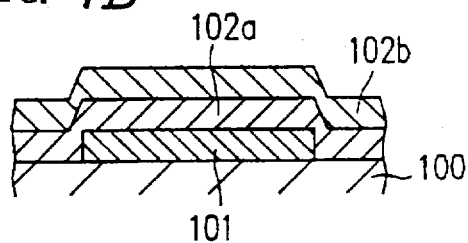

Next, as shown in FIGS. 4B and 5, the first insulating layer 102a having a thickness of about 100 nm and the second insulating layer 102b are deposited so as to cover the entire substrate. It is preferred that the second insulating layer 102a is thicker than the first insulating layer 102a. By such a thickness, it is possible to prevent the second insulating layer 102b from being disconnected by the difference in level of the edges of the first insulating layer 102a or the thickness of the second insulating layer 102b in the vicinity of the edges of the semiconductor island 101 from being too thin. As a deposition method, sputtering or a CVD method is used.

Figure 4C:
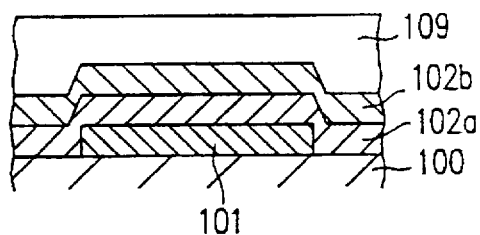
Figure 4D:
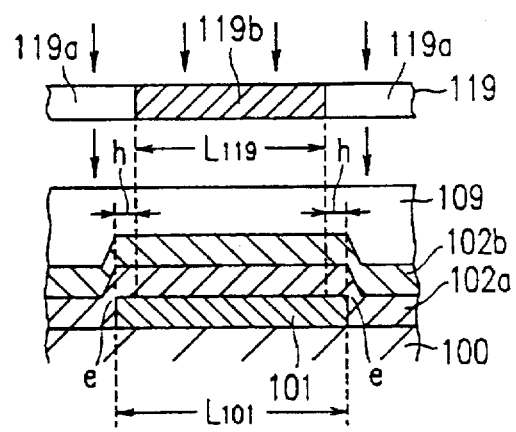

Subsequently, as shown in FIG. 4C, the entire substrate is covered with a negative photoresist film 109. As shown in FIG. 4D, the entire substrate is exposed to light in a direction as indicated with arrows in FIG. 4D through the photomask 119 having exposing portions 119a and a light shielding portion 119b.

A width L119 of the light shielding portion 119b of the photomask 119 is set to be narrower than a width L101 of the semiconductor island 101. The light shielding portion 119b has margins h for alignment of the mask for both edges e of the semiconductor island 101. The margin h for alignment of the mask is required to be in the range of about 0.1 to 1 µm.

Figure 4E:
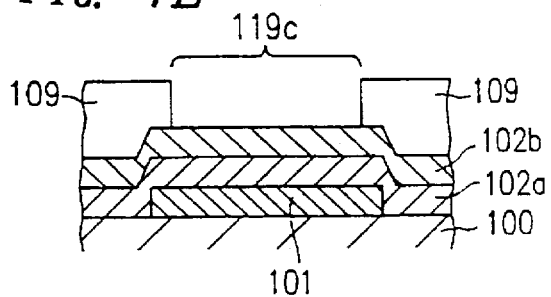
Figure 4F:
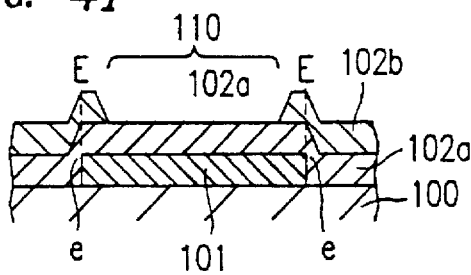
Figure 5C:
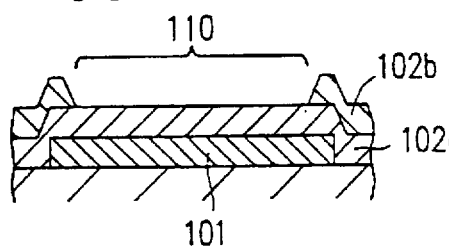

By the above exposure, an opening 119c similar to the semiconductor island 101 in shape and smaller than the semiconductor island 101 in size as shown in FIG. 4E is provided for the photoresist film 109. Then, by removing part of the second insulating layer 102b which is exposed through the opening 119c of the photoresist film 109, a concave portion 110 on the second insulating layer 102b as shown in FIGS. 4F and 5C is formed. The concave portion 110 of the second insulating layer 102b is positioned inside the edges E defined by projecting the edges e of the semiconductor island 101 onto the surface of the gate insulating film 102b in a direction perpendicular to the surface of the substrate 100.

It is preferred that the first insulating layer 102a and the second insulating layer 102b are made of different materials having respectively different etching rates. For example, silicon oxide can be used for the first insulating layer 102a, and silicon nitride can be used for the second insulating layer 102b.

In this case, an etching treatment can be conducted using a hydrofluoric acid type etchant. Since an etching rate of the first insulating layer 102a is slower than an etching rate of the second insulating layer 102b (about 1:2), the first insulating layer 102a can be utilized as an etching stop layer. Therefore, the etching can be easily controlled so as to form the concave portion 110 only through the second insulating layer 102b and expose the first insulating layer 102a.

Thus, the configuration such as a depth of the concave portion 110 of the second insulating layer 102b can be formed with high accuracy.

Figure 4G:
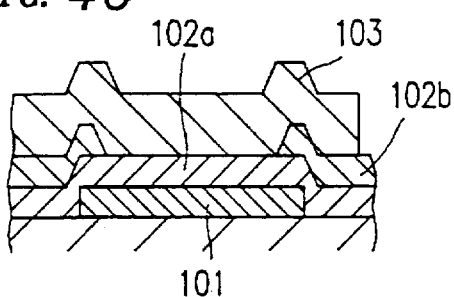
Figure 5D:
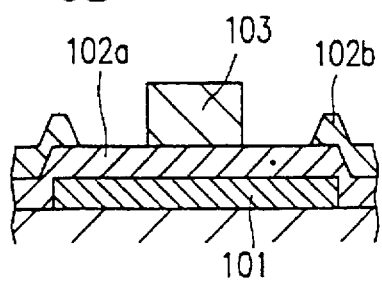

Next, as shown in FIGS. 4G and 5D, the gate electrode 103 is formed by using a conductive material.

Figure 4H:
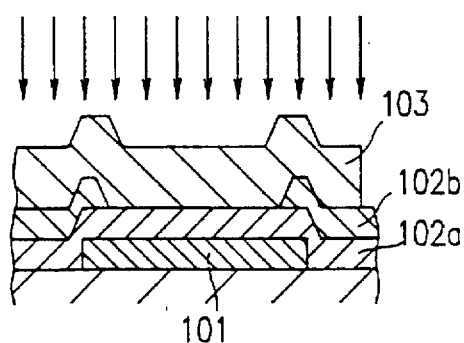
Figure 5E:
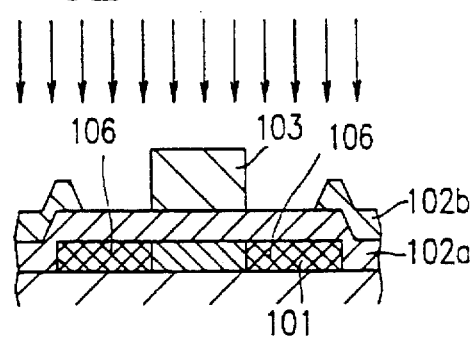

Then, as indicated with arrows in FIGS. 4H and 5E, donor ions or acceptor ions are implanted into the semiconductor island 101 by ion doping. Thereafter, by activating the dopant, the regions of the semiconductor island 101 which do not overlap the gate electrode 103 are rendered electrically conductive so as to form the source/drain regions 106.

Figure 4I:
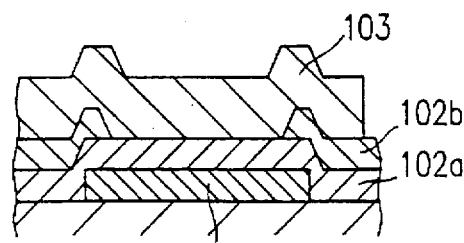
Figure 5F:
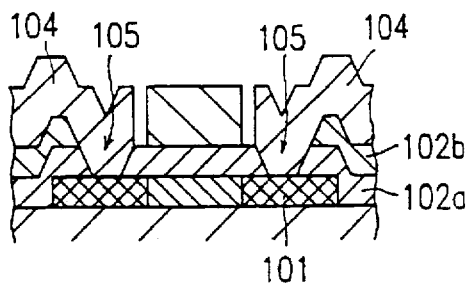

Finally, as shown in FIGS. 4I and 5F, contact holes 105 are formed on the first insulating layer 102a on the source/drain regions 106. Then, source/drain electrodes 104 are formed on the regions which do not overlap the gate electrode 103 so as to be electrically conductive with the source/drain regions 106 through the contact holes 105, thereby completing a TFT.

By fabricating the TFT in the above-described manner, the distance Le between the edges e of the semiconductor island 101 and the gate electrode 103 can be made greater than the distance Lc between the central portion a of the semiconductor island 101 and the gate electrode 103.

EXAMPLE 3

Still another fabrication method of the TFT having the configuration as shown in FIGS. 1A and 1B is described in Example 3.

FIGS. 6A through 6F and FIGS. 7A through 7F are cross-sectional views showing the fabrication process of the TFT according to Example 3. FIGS. 5A through 6F are cross-sectional view taken along the line 1B-1B' (dashed line) in FIG. 1A, and FIGS. 7A through 7F are cross-sectional view taken along the line 3A-3A' (dashed line) in FIG. 1A.

Figure 6A:
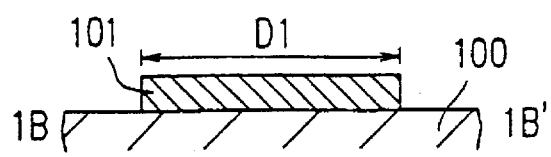
FIGS. 6A through 6F are cross-sectional views showing a fabrication process of the TFT according to Example 3 of the present invention, taken along the line 1B-1B' (dashed line) in FIG. 1A.

First, on the substrate 100 having an insulating surface or the substrate 100 on which an insulating film made of $SiO_2$ or $SiN_x$ is deposited to a thickness of about 100 nm by using a sputtering apparatus or a CVD apparatus, as shown in FIGS. 6A and 7A, a semiconductor silicon film is deposited to a thickness in the range of 10 nm to 200 nm by the CVD apparatus and the like. If a thickness of the semiconductor silicon film is out of this thickness range, the following problems may occur: when the semiconductor silicon film is too thin, an ON current across a TFT is lowered or the sufficient contact cannot be obtained; when the semiconductor silicon film is too thick, an OFF current increases. A preferred thickness of the semiconductor silicon film is in the range of 30 nm to 100 nm.

Subsequently, the semiconductor silicon film is crystallized by annealing the entire substrate 100 at about 600° C. In the case where the substrate 100 is made of a material sufficiently resistant to a temperature higher then 600° C., e.g., a quartz substrate, an annealing temperature can be raised. Moreover, the semiconductor silicon film can be crystallized by irradiating the semiconductor silicon film with a high-energy light beam such as an excimer laser instead of annealing the semiconductor silicon film.

After being crystallized, the semiconductor silicon film is patterned into an island shape so as to obtain a semiconductor island 101. The width D1 of the semiconductor island 101 in 1B-1B' direction is about 5 μm. The semiconductor island 101 can be obtained by forming a resist island on the semiconductor silicon film by photolithography and then etching the semiconductor silicon film by dry etching or the like. Since the etching process does not include a step of oxidizing the semiconductor silicon film, the unevenness as being generated in a thermal oxidation process is prevented from being formed on the edges of the semiconductor island 101.

Figure 6B:
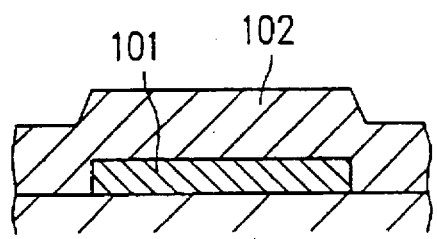

Next, as shown in FIGS. 6B and 7B, a gate insulating film 102 is deposited onto the semiconductor island 101 to a thickness of about 200 nm so as to cover the entire substrate. The gate insulating film 102 is deposited by sputtering or a CVD method.

Figure 6C:
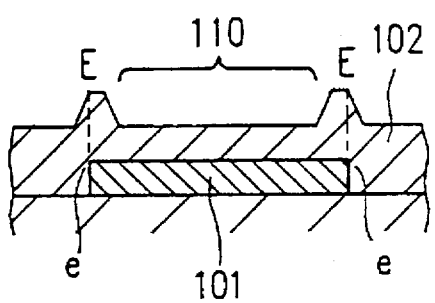

Next, a concave portion 110 as shown in FIGS. 6C and 7C is formed on the surface of the gate insulating film 102 by the same processes as shown in FIGS. 4C through 4E in Example 2. The concave portion 110 of the gate insulating film 102 is positioned inside the edges E defined by projecting the edges e of the semiconductor island 101 onto the surface of the gate insulating film 102 in a direction perpendicular to the surface of the substrate 100.

Figure 6D:
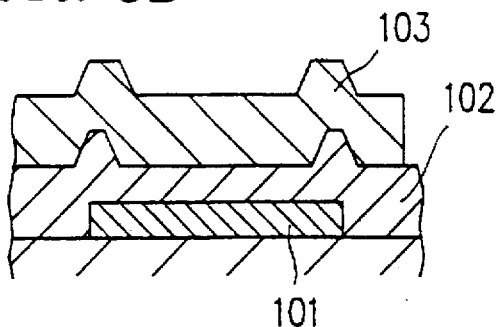

Next, as shown in FIGS. 6D and 7D, the gate electrode 103 is formed using a conductive material.

Figure 6E:
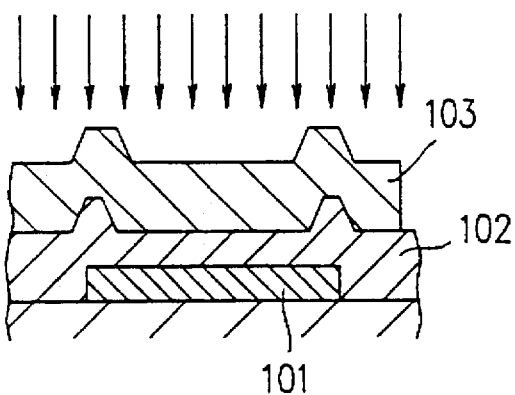

As indicated with arrows in FIGS. 6E and 7E, donor ions or acceptor ions are implanted into the semiconductor island 101 by ion doping. Thereafter, the dopant is activated. As shown in FIG. 7E, the regions of the semiconductor island 101 which do not overlap the gate electrode 103 are rendered electrically conductive so as to form the source/drain regions 106.

Figure 6F:
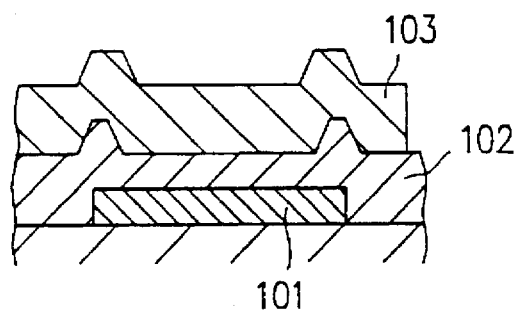

Finally, as shown in FIGS. 6F and 7F, the contact holes 105 are formed through the gate insulating film 102 at the positions corresponding to each of the source/drain regions 105. Then, the source/drain electrodes 104 are formed on the regions which do not overlap the channel region so as to conduct with the source/drain regions 106 through the contact holes 105, thereby completing a TFT.

EXAMPLE 4

Figure 8A:
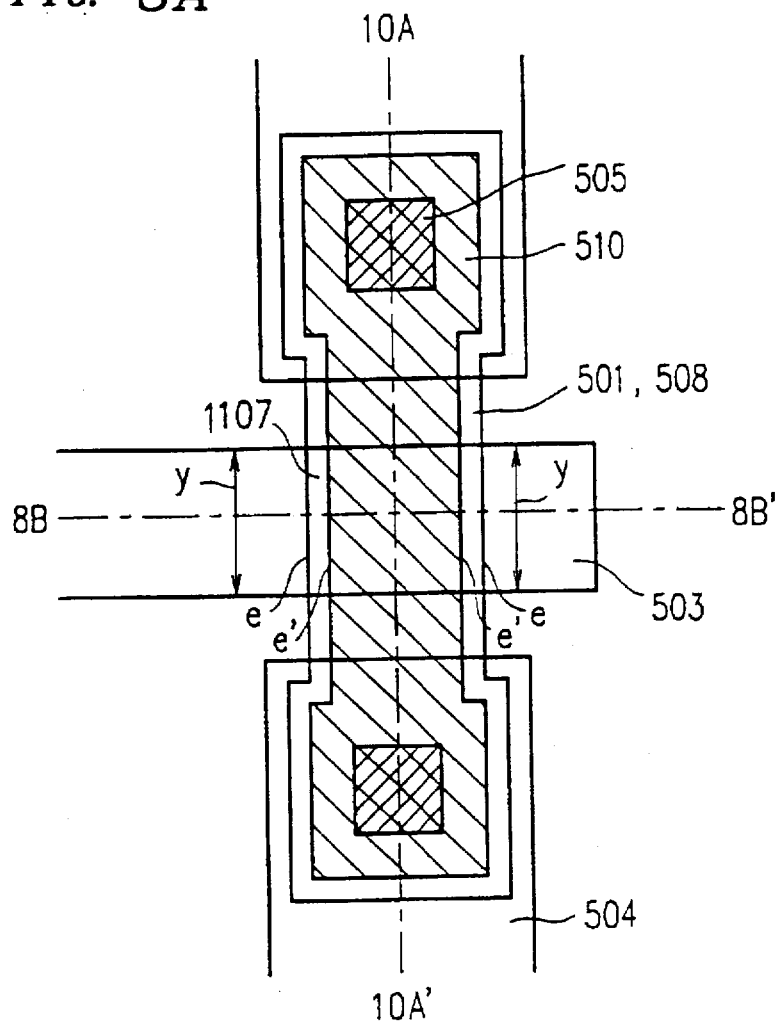
FIG. 8A is a plan view showing a TFT according to Example 4 of the present invention.
Figure 8B:
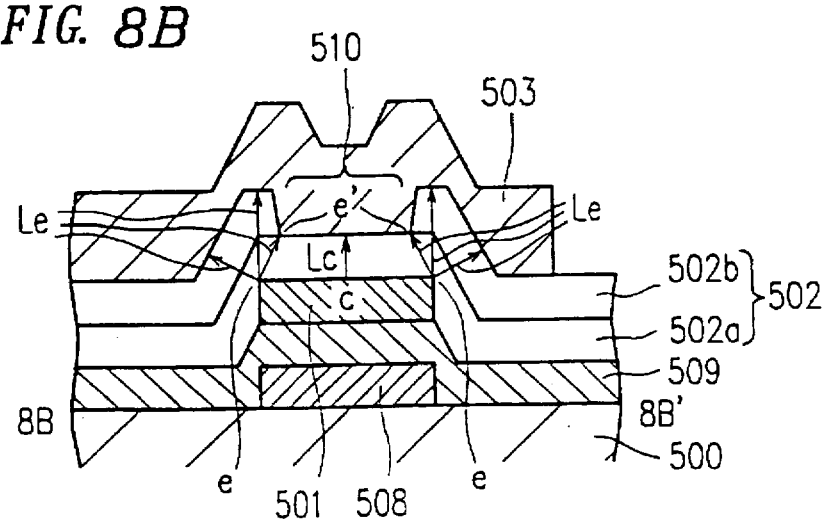
FIG. 8B is a cross-sectional view showing the TFT taken along a line 8B-8B' (dashed line) in a direction perpendicular to a paper face.

FIG. 8A is a plan view of a TFT having another configuration according to Example 4 of the present invention, FIG. 8B is a cross-sectional view of the TFT taken along a line 8B-8B' (dashed line) in FIG. 8A perpendicular to the paper face.

In the TFT, a light shielding film 508 is formed on a light transmitting substrate 500. On the light shielding film 508, the light transmitting insulating film 509 is formed so as to cover the entire substrate. A semiconductor island 501 is formed on the region of the insulating film 509 corresponding to the light shielding film 508.

On the insulating film 509, a gate insulating film 502 is formed so as to cover the semiconductor island 501. In Examples 4 and 5, the gate insulating film 502 can be a single layer or include a plurality of layers, and is made of at least one insulating material such as $SiO_2$, $SiN_x$ and SiON. As shown in FIG. 8B, the gate insulating film 502 includes a first insulating layer 502a and a second insulating layer 502b.

As shown in FIG. 8B, a concave portion 510 is formed through the second insulating layer 502b above the semiconductor island 501. The total thickness of the first insulating layer 502a and the second insulating layer 502b in a region where the concave portion is formed above the semiconductor island 501 is smaller than that of the first insulating layer 502a and the second insulating layer 502b in a region other then the region where the concave portion 510 is formed. It is noteworthy that the concave portion 510 has a similar shape and a small size as compared with that of the semiconductor island 501.

A gate electrode 503 is formed on the second insulating layer 502b so as to cover the exposed part of the first insulating layer 502a. As shown in FIG. 8A, source/drain regions (not shown) are formed on the regions of the semiconductor island 501 which do not overlap the gate electrode 503. The source/drain regions are connected with source/drain electrodes 504 via contact holes 505.

As can be seen from FIGS. 8A and 8B, the edges e' of the concave portion 510 are positioned inside the edges e of the semiconductor island 501. By this configuration, a distance Le between the edge e of the semiconductor island 501 and the gate electrode 503 is larger than a distance Lc between a central portion c of the semiconductor island 501 and the gate electrode 503 as shown in FIG. 8B.

As shown in FIG. 8A, the light shielding film 508 has the same shape and size as those of the semiconductor island 501. The light shielding film 508 is formed at the position defined by vertically projecting the semiconductor island 501 onto the surface of the light transmitting substrate 500. However, the shape and size of the light shielding film 508 are not limited to the above shape and size. The light shielding film 508 can have any shape and size as long as light incident on the bottom face of the light transmitting substrate 500 is prevented from passing therethrough to reach the semiconductor island 501.

In FIG. 8B, the light shielding film 505 is formed on the light transmitting substrate 500. However, the light shielding film 508 can be placed in any region of the light transmitting substrate 500 (for example, on the bottom face of the light transmitting substrate 500 or in the light transmitting substrate 500) as long as light which is incident on the bottom face of the light transmitting substrate 500 is prevented from passing therethrough to reach the semiconductor island 501.

By providing the light shielding film 508, a leak current is prevented from increasing due to light radiated onto the semiconductor island, in particular, the channel region of the semiconductor island.

Next, the fabrication process of the TFT having the configuration as shown in FIGS. 8A and 8B will be described.

FIGS. 9A through 9I and FIGS. 10A through 10G are cross-sectional views showing the fabrication process of the TFT. FIGS. 9A through 9I are cross-sectional views taken along a line 8B-8B' (dashed line) in FIG. 8A, and FIGS. 10A through 10G are cross-sectional views taken along a line 10A-10A' (dashed line) in FIG. 8A.

First, as shown in FIGS. 9A and 10A, a refractory metal film having light shielding properties made of, for example, Ta is deposited on the light transmitting substrate 500 made of glass or the like to a thickness in the range of 100 nm to 300 nm by using a sputtering apparatus or the like. Then, the refractory metal film is patterned into an island shape so as to obtain the light shielding film 508. Except for metals, a material, for example, an insulating material can be used for the light shielding film 508 as long as the material has light shielding properties.

If the light shielding film 508 is too thin, sufficient light shielding effect cannot be obtained. If the light shielding film is too thick, it becomes more difficult to form the other films on the light shielding film 508 due to a difference in level of the light shielding film 508. A preferred thickness of the light shielding film 508 is in the range of about 150 nm to 200 nm. The light shielding film 508 should have sufficient heat-resistance so as to be annealed in a later process for forming a semiconductor silicon film.

Next, as shown in FIGS. 9D and 10B, the light transmitting insulating film 509 made of $SiO_2$, $SiN_x$ or the like is formed on the substrate 500 to a thickness of about 200 nm so as to cover the light shielding film 508. For example, in the case where a light shielding film having an insulating surface is used instead of the light shielding film 508 made of the above-mentioned metal, the light transmitting insulating film 509 can be omitted.

Subsequently, a semiconductor silicon film is deposited on the insulating film 509 to a thickness in the range of 10 nm to 200 nm, preferably, 30 nm to 100 nm by using a CVD apparatus or the like. Then, the entire substrate is annealed at about 600° C. so as to crystallize the semiconductor silicon film. In order to crystallize the semiconductor silicon film, the semiconductor silicon film can be irradiated with a high-energy light beam such as an excimer laser instead of being annealed. After being crystallized, the semiconductor silicon film is patterned into an island shape so as to obtain the semiconductor island 501. A width D1 of the semiconductor island 501 in a direction 8B-8B' in FIG. 8A is about 5 μm.

The semiconductor island 501 and the light shielding film 508 are formed so as to have the same shape. The semiconductor island 501 is formed within a region defined by vertically projecting the light shielding film 508 onto the light transmitting substrate 500.

The patterning of the semiconductor island 501 can be conducted by forming a resist island on the semiconductor silicon film by photolithography and subsequently etching the semiconductor silicon film with a method such as dry etching. Since the etching process does not include a step of oxidizing the silicon film, the unevenness as being generated in a thermal oxidation process is prevented from being formed on the edges of the semiconductor island 501.

Alternatively, the semiconductor island 501 having a shape identical with that of the light shielding film 508 can be formed by the following process utilizing the light shielding film 508 as a mask. A photoresist film is applied onto the semiconductor silicon film. Then, the entire substrate is exposed to light from the substrate side, that is, from the bottom face of the substrate 500 so as to form a resist island having a shape identical with that of the light shielding film 508. Then, the semiconductor silicon film is selectively etched by dry etching or the like, thereby forming the semiconductor island 501.

Next, as shown in FIGS. 9C and 10C, the first insulating layer 502a having a thickness of about 100 nm and the second insulating layer 502b are deposited onto the semiconductor island 501 in this order so as to cover the entire substrate. The first insulating layer 502a and the second insulating layer 502b are deposited by sputtering or a CVD method.

Next, as shown in FIG. 9D, the entire substrate is covered with the negative type photoresist film 109. As indicated with arrows, the entire substrate is exposed to light from the bottom face of the substrate 500 using the light shielding film 508 as a mask. By over exposing the photoresist film 109, an opening 519 similar to the semiconductor island 501 in shape and smaller then the semiconductor island 501 in size is formed through the resist film 109 as shown in FIG. 9E. The size of the opening 519 can be controlled by varying the exposure time. The light incident on the light shielding film 508 is almost completely prevented from passing therethrough. On the other hand, part of the light incident on the first insulating layer 502a and the second insulating layer 502b passes through the first insulating layer 502a and the second insulating layer 502b to reach the photoresist film 109.

By etching the second insulating layer 502b through the opening 519 of the resist film, the concave portion 510 of the second insulating layer 502b as shown in FIGS. 9F and 10D is formed. As shown in FIG. 9F, the concave portion 510 of the second insulating layer 502b is positioned inside the positions of the edges E defined by projecting the edges e of the semiconductor island 501 onto the surface of the gate insulating film 502b in a direction vertical to the surface of the substrate 500. The concave portion 510 has a shape substantially identical with the shape of the light shielding film 508 and the shape of the semiconductor island 501.

It is preferred that the first insulating layer 502a and the second insulating layer 502b are made of different materials having respectively different etching rates. For example, the first insulating layer 502a can be made of silicon oxide, and the second insulating layer 502b can be made of silicon nitride.

In this case, an etching treatment can be conducted using a hydrofluoric acid type etchant. Since an etching rate of the first insulating layer 502a is slower than an etching rate of the second insulating layer 502b (about 1:2), the first insulating layer 502a can be utilized as an etching stop layer, Therefore, the etching can be easily controlled so as to expose the first insulating layer 502a and form the concave portion 510 through the second insulating layer 502b. Thus, the configuration such as a depth of the concave portion 510 of the second insulating layer 502b can be formed with high accuracy.

Next, as shown in FIGS. 9G and 10E, the gate electrode 503 is formed by using a conductive material.

Then, as indicated with arrows in FIGS. 9H and 10F, donor ions or acceptor ions are implanted into the semiconductor island 501 by ion doping. Thereafter, by activating the dopant, the regions of the semiconductor island 501 which do not overlap the gate electrode 503 are rendered electrically conductive so as to form the source/drain regions 506. A region of the semiconductor island 501 between the source region 505 and the drain region 506 serves as a channel region.

Finally, as shown in FIGS. 9I and 10G, contact holes 505 are formed through parts of the first insulating layer 502a on the source/drain regions 506. Then, source/drain electrodes 504 are formed so as to be electrically conductive with the source/drain regions 506 through the contact holes 505 in the regions which do not overlap the gate electrode 503, thereby completing a TFT.

As described above, the concave portion 510 of the gate insulating films 502a and 502b and the semiconductor island 501 can be easily formed with high accuracy by self-alignment, using the light shielding film 508 as a mask.

In the case where the light shielding film 508 is used as a mask only for forming the concave portion 510 of the first and second insulating layers 502a and 502b, the semiconductor island 501 and the light shielding film 508 do not need to have the same shape as long as the edges defined by projecting the light shielding film 508 onto the surface of the semiconductor island 501 in a direction vertical to the surface of the light transmitting substrate 500 are identical with the edges e of the channel region 1107 of the semiconductor island 501 as shown in FIG. 8A. The edges e of the channel region 1107 correspond to edges in a direction indicated by arrows y in FIG. 8A. This is also applied to Examples 5 through 7 described below.

EXAMPLE 5

Another method for fabricating the TFT having the configuration shown in FIGS. 8A and 8B will be described.

FIGS. 11A through 11G and FIGS. 12A through 12G are cross-sectional views showing the fabrication process of the TFT according to Example 5. FIGS. 11A through 11G are cross-sectional views taken along the line 8B-8B' (dashed line) shown in FIG. 8A, and FIGS. 12A through 12G are cross-sectional view taken along the line 10A-10A' (dashed line) shown in FIG. 8A.

Figure 11A:
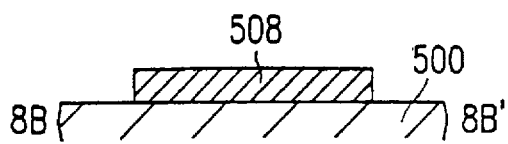
FIG. 11A through 11G are cross-sectional views showing a fabrication process of the TFT according to Example 5 of the present invention, taken along the line 8B-8B' (dashed line) in FIG. 8A.

First, as shown in FIGS. 11A and 11A, a refractory metal film having light shielding properties made of, for example, Ta is deposited on the light transmitting substrate 500 to a thickness in the range of 100 nm to 300 nm, preferably in the range of 150 nm to 200 nm, by using a sputtering apparatus or the like. Then, the refractory metal film is patterned into an island shape so as to obtain the light shielding film 508. The light shielding film 508 should have sufficient heat-resistance so as to be annealed in a later process for forming a semiconductor silicon film.

Figure 11B:
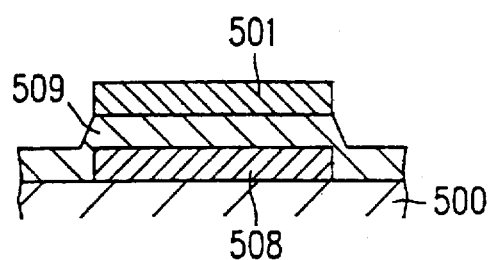
Figure 12A:
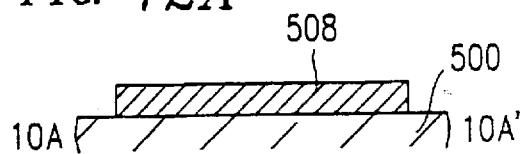
FIG. 12A through 12G are cross-sectional views showing the fabrication process of the TFT according to Example 5, taken along the line 10A-10A' (dashed line) in FIG. 8A.
Figure 12B:
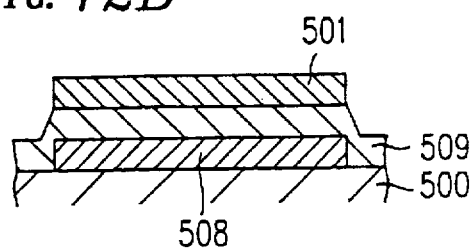

Next, as shown in FIGS. 11B and 12B, the light transmitting insulating film 509 made of $SiO_2$ or $SiN_x$ is deposited on the substrate 500 to a thickness of about 200 nm so as to cover the light shielding film 508. If a light shielding film having an insulating surface is used instead of the light shielding film 508 made of metal, the light transmitting insulating film 509 may be omitted.

Subsequently, a semiconductor silicon film is deposited onto the insulating film 509 to a thickness in the range of about 10 nm to 200 nm, preferably, in the range of about 30 nm to 100 nm by using a CVD apparatus or the like. Then, the semiconductor silicon film is crystallized by annealing the entire substrate 500 at about 600° C. The semiconductor silicon film can be crystallized by irradiating the semiconductor silicon film with a high-energy light beam such as an excimer laser instead of annealing the semiconductor silicon film. After the semiconductor silicon film is crystallized, the semiconductor silicon film is patterned into an island shape so as to obtain the semiconductor island 501.

The semiconductor island 501 and the light shielding film 508 are formed so as to have the same shape. The semiconductor island 501 is formed within a region defined by vertically projecting the light shielding film 508 onto the surface of the light transmitting substrate 500.

The patterning of the semiconductor island 501 is performed by forming a resist film on the semiconductor silicon film by photolithography and then etching the semiconductor silicon film by dry etching or the like. Since the etching process does not include a step of oxidizing the silicon film, the unevenness as being generated in a thermal oxidation process is prevented from being formed on the edges of the semiconductor island 501.

Alternatively, the semiconductor island 501 having the same shape as that of the light shielding film 508 can be formed by utilizing the light shielding film 508 as a mask as follows. After a photoresist film is applied onto the semiconductor silicon film, the entire substrate is exposed to light from the substrate side, i.e., from the bottom face of the substrate 500 so as to form a resist island having the same shape as that of the light shielding film 508. Thereafter, the semiconductor island 501 is formed by selectively etching the semiconductor silicon film by dry etching or the like.

Figure 11C:
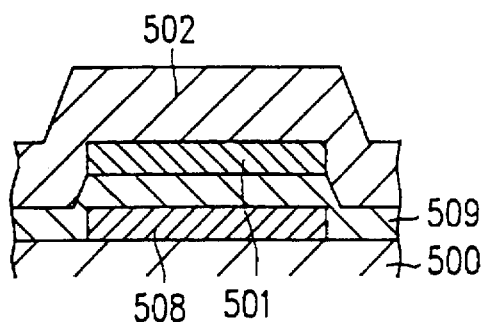
Figure 12C:
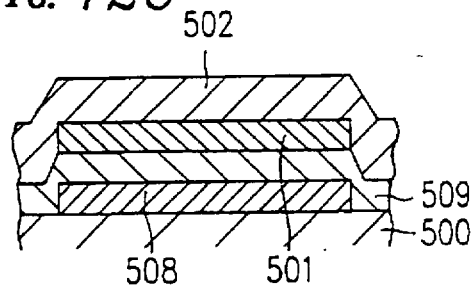

Next, as shown in FIGS. 11C and 12C, the gate insulating film 502 having a thickness of about 200 nm is deposited onto the semiconductor island so as to cover the entire substrate. The gate insulating film 502 is deposited by sputtering or a CVD method.

Next, in a similar method to that shown in FIGS. 9D and 9E of Example 4, the entire substrate is covered with a negative photoresist film. Then, the substrate 500 is exposed to light from the bottom face of the substrate 500 using the light shielding film 508 as a mask. By over exposing the photoresist film, an opening similar to the semiconductor island 501 in shape and smaller than the semiconductor island 501 in size is formed through the photoresist film. The size of the opening can be controlled by varying the exposure time.

Figure 11D:
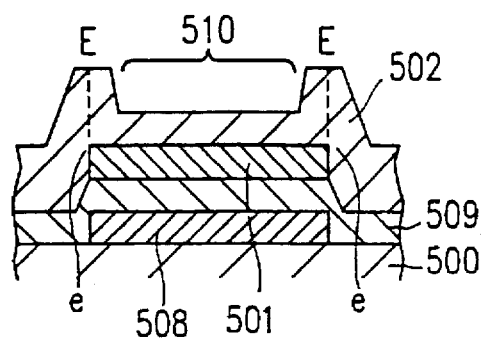
Figure 12D:
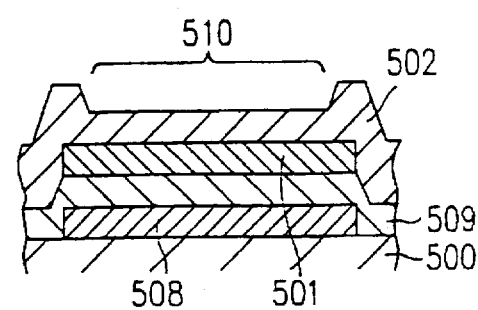

The concave portion 510 of the gate insulating film 502 as shown in FIGS. 11D and 12D is formed by removing the upper part of the gate insulating film 502 from the opening of the photoresist film by etching or the like. The concave portion 510 of the gate insulating film 502 is positioned inside the positions of the edges E defined by projecting the edges e of the semiconductor island 501 onto the surface of the gate insulating film 502 in a direction perpendicular to the surface of the substrate 500.

Figure 11E:
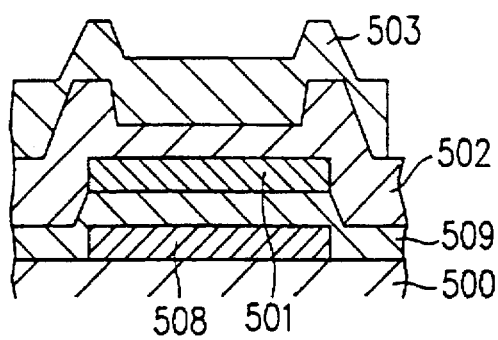
Figure 12E:
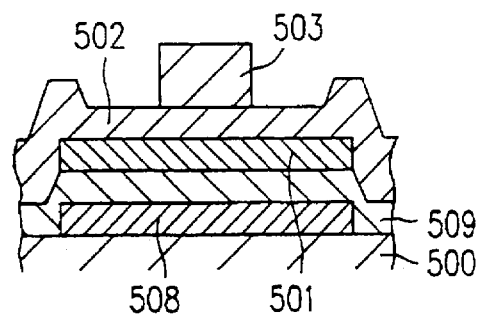

Next, as shown in FIGS. 11E and 12E, the gate electrode 503 is formed by using a conductive material.

Figure 11F:
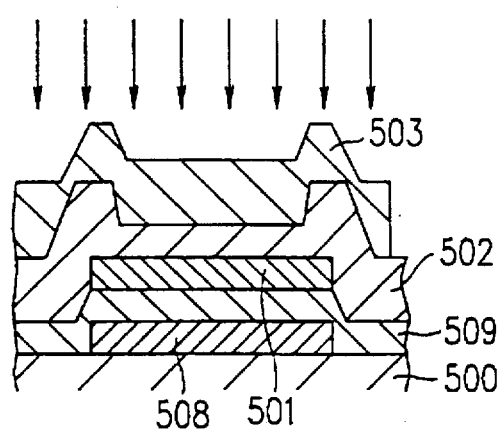
Figure 12F:
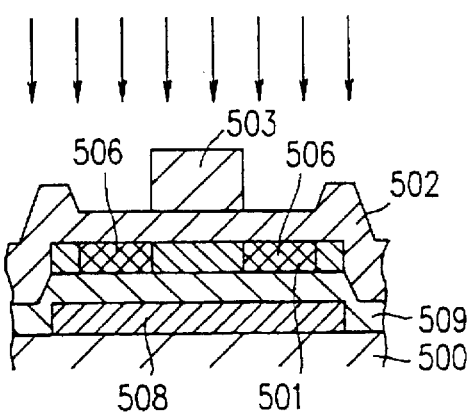

As indicated with arrows in FIGS. 11F and 12F, donor or acceptor ions are implanted into the semiconductor island 501 by ion doping. Thereafter, a process for activating the dopant is conducted. By this process, the regions of the semiconductor island 501 which do not overlap the gate electrode 503 are rendered electrically conductive to form source/drain regions 506 as shown in FIG. 12F. A region of the semiconductor island 501 between the source region 506 and the drain region 506 serves as a channel region.

Figure 11G:
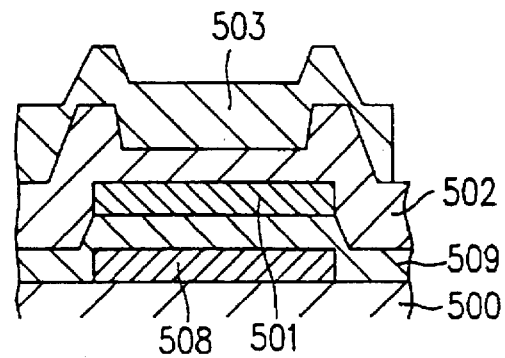
Figure 12G:
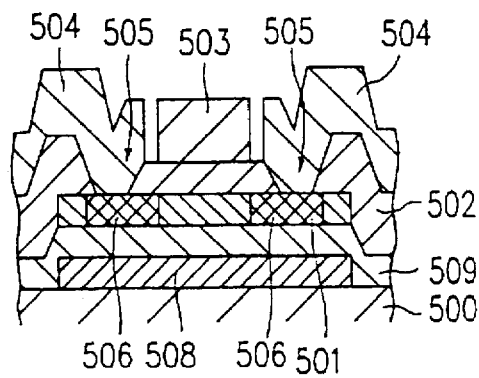

Finally, as shown in FIGS. 11G and 12G, contact holes 505 are formed through parts of the gate insulating film 502 on the source/drain regions 506. The source/drain electrodes 504 are formed in regions which do not overlap the gate electrodes 503 so as to be electrically conductive with the source/drain regions 506 through the contact holes 505, thereby completing a TFT.

EXAMPLE 6

Figure 13A:
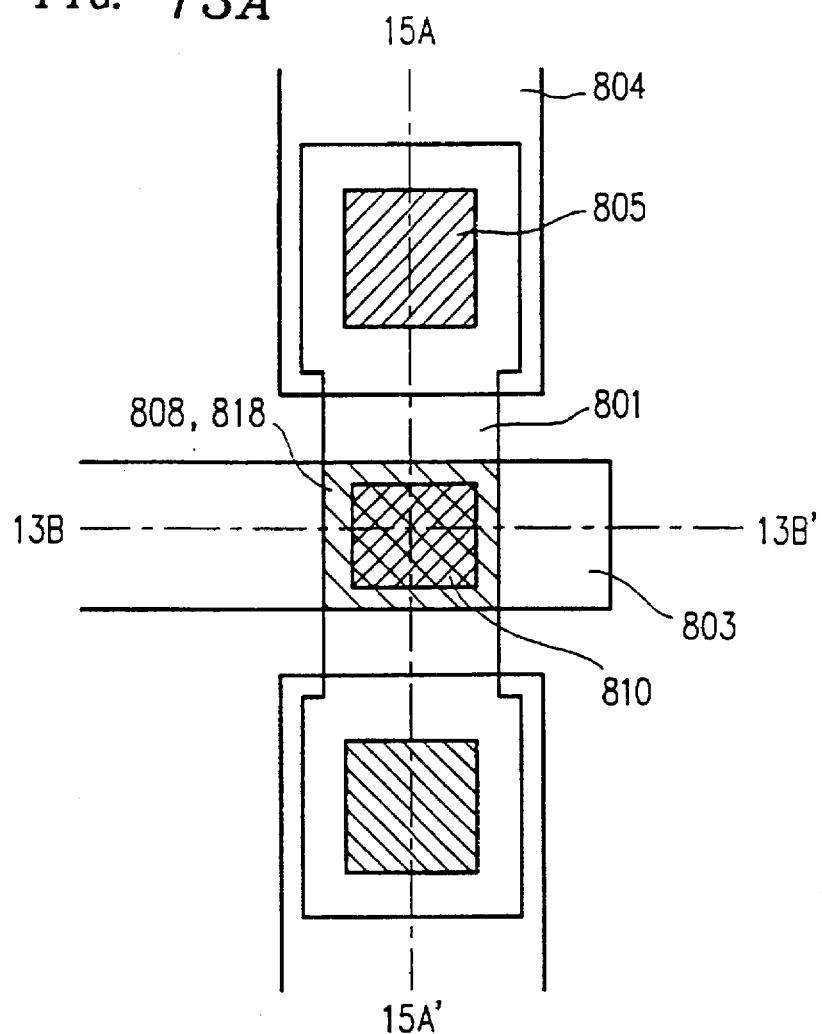
FIG. 13A is a plan view showing a TFT according to Example 6 of the present invention.
Figure 13B:
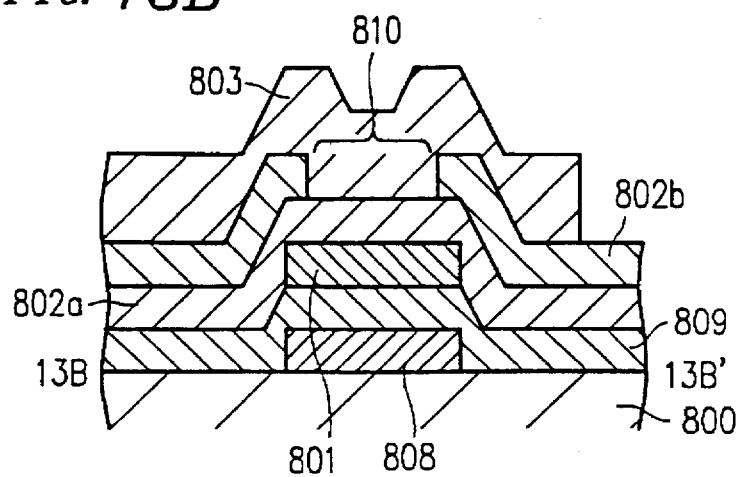
FIG. 13B is a cross-sectional view showing the TFT taken along a line 13B-13B' (dashed line) in a direction perpendicular to a paper face.

FIG. 13A is a plan view showing a TFT according to Example 6 of the present invention, and FIG. 13B is a cross-sectional view showing the TFT, taken along a line 13B-13B' (dashed line) in FIG. 13A in a direction perpendicular to the paper face.

In this TFT, a light shielding film 808 is formed on a transparent substrate 800. A light transmitting insulating film 809 is formed on the light shielding film 808 so as to cover the entire substrate 800. A semiconductor island 801 is formed on the light transmitting insulating film 809.

A first insulating layer 802a and a second insulating layer 802b are formed on the semiconductor island 801 in this order so as to cover the entire substrate. The gate insulating film 802 can be a single layer or a plurality of layers, and is made of at least one of insulating materials such as $SiO_2$, $SiN_x$ and SiON.

A gate electrode 803 is formed on the second insulating layer 802b so as to cover the exposed part of the first insulating layer 802a. As shown in FIG. 13A, source/drain regions are formed on regions of the semiconductor island 801 which do not overlap the gate electrode 803. The source/drain regions are connected with the source/drain electrodes 804 via contact holes 805.

As shown in FIGS. 13A and 13D, the light shielding film 808 is formed in a region defined by vertically projecting a channel region 818 of the semiconductor island 801 onto the surface of the light transmitting substrate 800. The TFT of Example 6 shown in FIGS. 13A and 13B differs from that of Example 4 shown in FIGS. 8A and 8B in configuration in the following point. In the TFT of Example 6 as shown in FIG. 13A, the light shielding film 808 has the size equal to or larger than that of the channel region 881 of the semiconductor island 801.

Next, a fabrication process of the TFT having the configuration as shown in FIGS. 13A and 13B will be described.

FIGS. 14A through 14G and 15A through 15G are cross-sectional views showing the fabrication process of the TFT according to Example 6. FIGS. 14A through 14G are cross-sectional views, taken along a line 13B-13B' (dashed line) in FIG. 13A, and FIGS. 15A through 15G are cross-sectional views, taken along a line 15A-15A' (dashed line) in FIG. 13A.

Figure 14A:
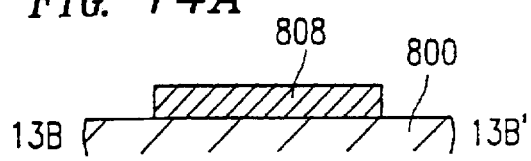
FIG. 14A through 14G are cross-sectional views showing a fabrication process of the TFT according to Example 6 of the present invention, taken along the line 13B-13B' (dashed line) in FIG. 13A.
Figure 14B:
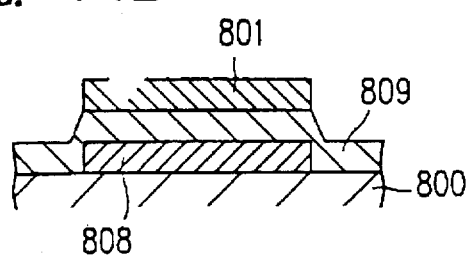
Figure 15A:
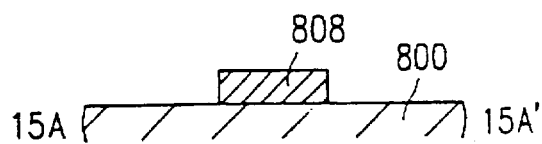
FIGS. 15A through 15G are cross-sectional views showing the fabrication process of the TFT according to Example 6, taken along a line 15A-15A' (dashed line) in FIG. 13A.

First, as shown in FIGS. 14A and 15A, a refractory metal film having light shielding properties made of, for example Ta, is deposited on the light transmitting substrate 800 to a thickness in the range of 100 nm to 300 nm by using a sputtering apparatus or the like. Then, the refractory metal film is patterned into an island shape so as to obtain the light shielding film 808. A material except metals, for example, an insulating material, can be used for the light shielding film 808 as long as the material has light shielding properties. If the light shielding film 808 is too thin, sufficient light shielding effect cannot be obtained. If the light shielding film is too thick, it becomes more difficult to form the other films on the light shielding film 808 due to a difference in level of the light shielding film 808. A preferred thickness of the light shielding film 808 is in the range of about 150 nm to 200 nm.

The light shielding film 808 has the same size as that of a channel region 818 of the semiconductor island 801. The light shielding film 808 should have sufficient heat-resistance so as to be annealed in a later process for forming a semiconductor silicon film.

Figure 14C:
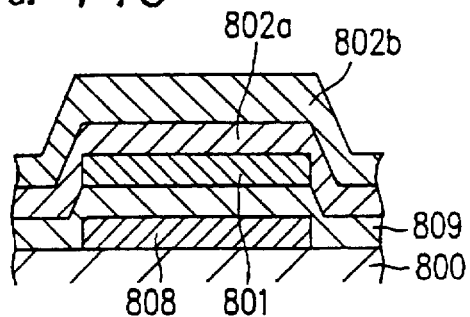
Figure 14D:
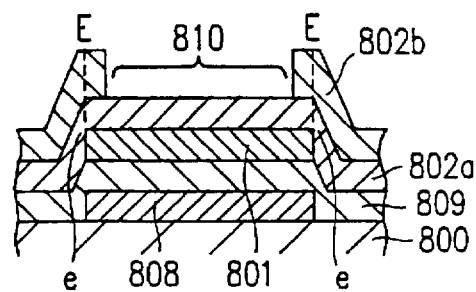
Figure 15B:
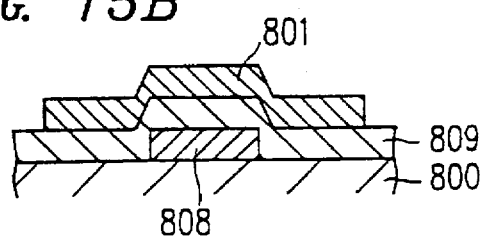

Next, as shown in FIGS. 14D and 15B, the light transmitting insulating film 809 made of $SiO_2$, $SiN_x$ or the like is formed on the substrate 800 to a thickness of about 200 nm so as to cover the light shielding film 808. Subsequently, a semiconductor silicon film is deposited on the insulating film 809 to a thickness in the range of 10 nm to 200 nm, preferably, 30 nm to 100 nm by using a CVD apparatus or the like.

Then, the entire substrate is annealed at about 600° C. so as to crystallize the semiconductor silicon film. Alternatively, the semiconductor silicon film can be crystallized by being irradiated with a high-energy light beam such as an exciter laser instead of being annealed. After being crystallized, the semiconductor silicon film is patterned into an island shape so as to obtain the semiconductor island 801.

The patterning of the semiconductor island 801 can be performed by forming a resist island on the semiconductor silicon film by photolithography and subsequently etching selectively the semiconductor silicon film with a method such as dry etching. Since the etching process does not include a step of oxidizing the silicon film, the unevenness as being produced in thermal oxidation is prevented from being formed on the edges of the semiconductor island 801.

Figure 15C:
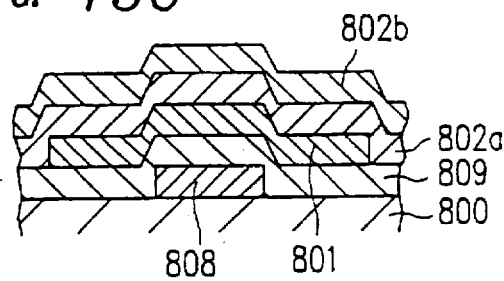

Next, as shown in FIGS. 14C and 15C, the first insulating layer 802a having a thickness of about 100 nm and the second insulating layer 802b are deposited onto the semiconductor island 801 in this order so as to cover the entire substrate. The first insulating layer 802a and the second insulating layer 802b are deposited by sputtering or a CVD method.

Next, in the same method as that shown in FIGS. 9D and 9E of Example 4, the entire substrate is covered with a negative type photoresist film. Then, the entire substrate is exposed to light from the bottom face of the substrate 800 using the light shielding film 808 as a mask. By over exposing the photoresist film, an opening similar to the channel region 818 of the semiconductor island 801 in shape and smaller than the channel region 818 of the semiconductor island 801 in size is formed through the resist film. The size of the opening can be controlled by varying the exposure time.

The light incident on the light shielding film 808 is almost completely prevented from passing therethrough. However, part of the light which is incident on the first insulating layer 802a and the second insulating layer 802b passes through the first insulating layer 802a and the second insulating layer 802b to reach the photoresist film.

Figure 15D:
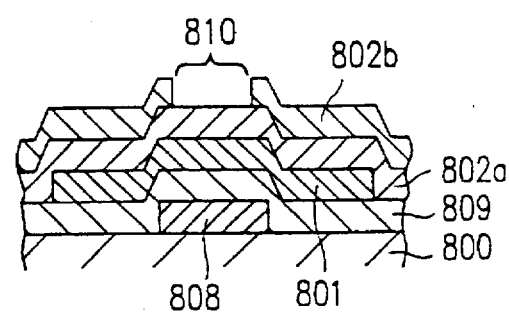

By selectively etching the second insulating layer 802b through the opening of the resist film, the concave portion 810 is formed through the second insulating layer 802b as shown in FIGS. 14D and 15D. The concave portion 810 of the second insulating layer 802b is positioned inside the positions of the edges E defined by projecting the edges e of the semiconductor island 801 on the surface of the gate insulating layer 802b in a direction perpendicular to the surface of the substrate 800. The concave portion 810 has a shape substantially identical with the shape of the light shielding film 808 and the shape of the channel region 818 of the semiconductor island 801.

Figure 14E:
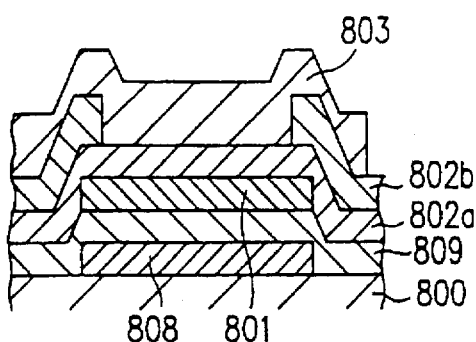
Figure 15E:
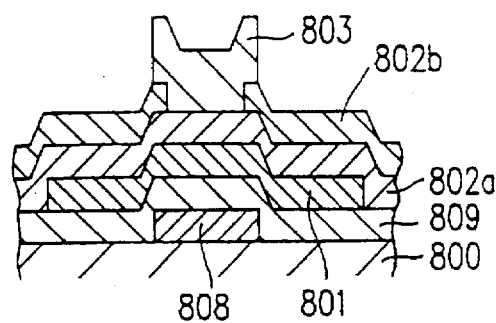

Next, as shown in FIGS. 14E and 15E, the gate electrode 803 is formed by using a conductive material.

Figure 14F:
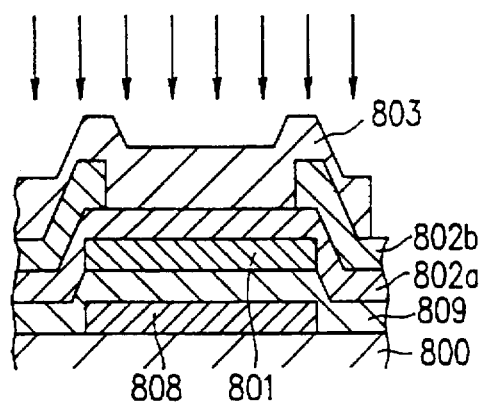
Figure 14G:
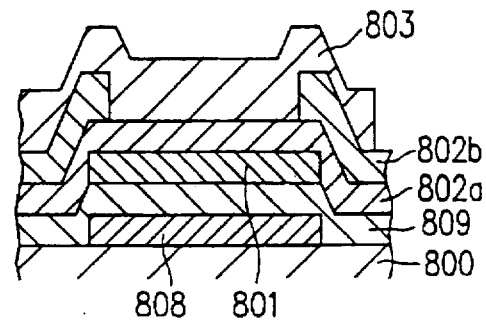
Figure 15F:
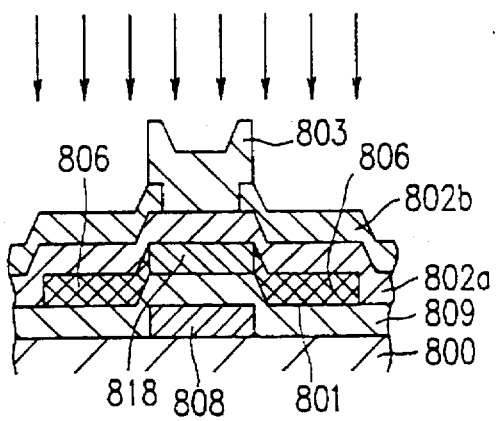

Then, as indicated with arrows in FIGS. 14F and 15F, donor ions or acceptor ions are implanted into the semiconductor island 801 by ion doping. Thereafter, by activating the dopant, regions of the semiconductor island 801 which do not overlap the gate electrode 803 are rendered electrically conductive so as to form the source/drain regions 805. A region of the semiconductor island 801 between the source region 806 and the drain region 806 serves as a channel region.

Figure 15G:
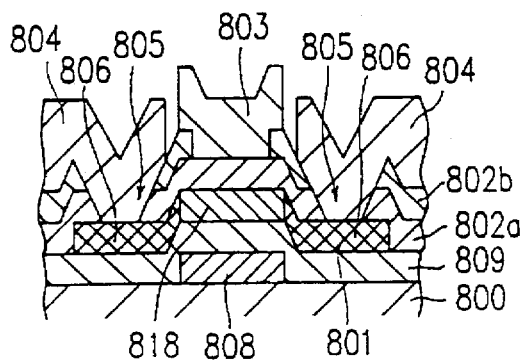

Finally, as shown in FIG. 15G, contact holes 805 are formed through the first insulating layer 802a on the source/drain regions 806. Then, source/drain electrodes 804 are formed on regions which do not overlap the gate electrode 803 so as to be electrically conductive with the source/drain regions 806 through the contact holes 805, thereby completing a TFT.

EXAMPLE 7

Another method for fabricating the TFT having the configuration shown in FIGS. 13A and 13B will be described in Example 7.

FIGS. 16A through 16G and FIGS. 17A through 17G are cross-sectional view showing the configuration of the TFT according to Example 7. As shown in FIGS. 18A and 17A, a refractory metal film having light shielding properties made of, for example, Ta, is deposited on the light transmitting substrate 800 to a thickness in the range of 100 nm to 300 nm by using a sputtering apparatus or the like. Then, the refractory metal film is patterned into an island shape so as to obtain the light shielding film 808.

Except for metals, a material, for example, an insulating material, can be used for the light shielding film 808 as long as the material has light shielding properties. If the light shielding film 508 is too thin, sufficient light shielding effect cannot be obtained. If the light shielding film is too thick, it becomes more difficult to form further films on the light shielding film 808 due to a difference in level of the light shielding film 808. A preferred thickness of the light shielding film 808 is in the range of about 150 nm to 200 nm.

The light shielding film 808 has the same size as that of the channel region 818 of the semiconductor island 801, The light shielding film 808 should have sufficient heat-resistance to withstand annealed in a later process for forming a semiconductor silicon film.

Figure 16A:
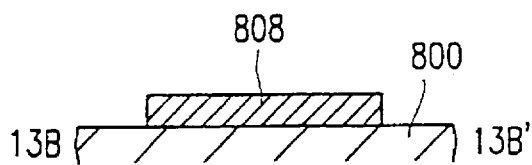
FIG. 16A through 16G are cross-sectional views showing a fabrication process of the TFT according to Example 7 of the present invention, taken along the line 13B-13B' (dashed line) in FIG. 13A.
Figure 16B:
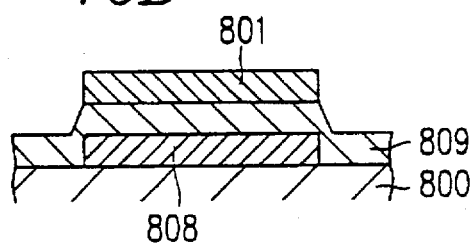
Figure 17A:
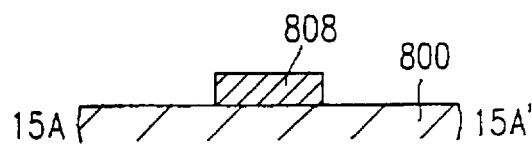
FIGS. 17A through 17G are cross-sectional views showing a fabrication process of the TFT according to Example 7, taken along a line 15A-15A' (dashed line) in FIG. 13A.
Figure 17B:
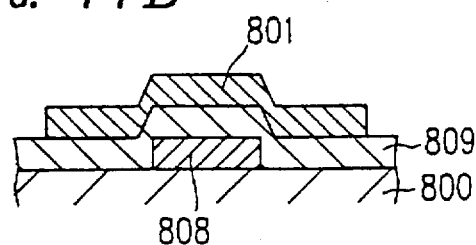
Figure 18A:
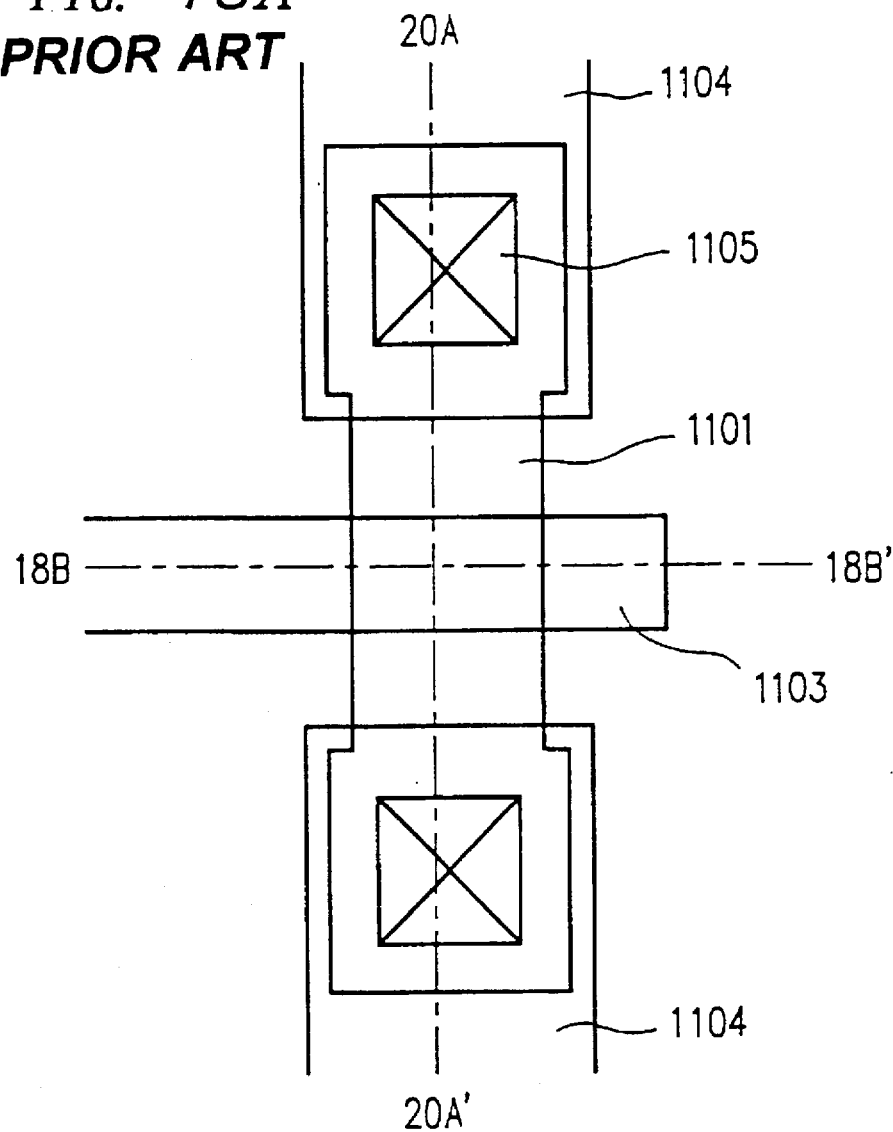
FIG. 18A is a plan view showing a conventional TFT.
Figure 18B:
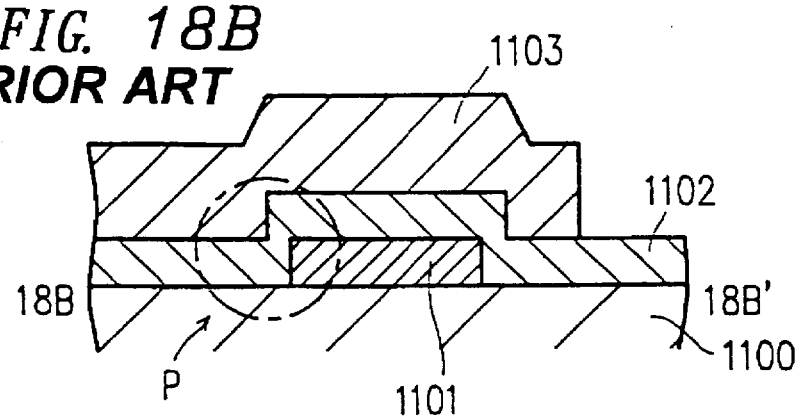
FIG. 18B is a cross-sectional view taken along a line 18B-18B' (dashed line) in FIG. 18A.
Figure 19A:
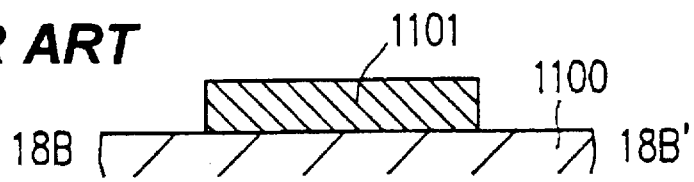
FIGS. 19A through 19D are cross-sectional views showing a fabrication process of the conventional TFT, taken along a line 18B-18B' (dashed line) in FIG. 18A.
Figure 19B:
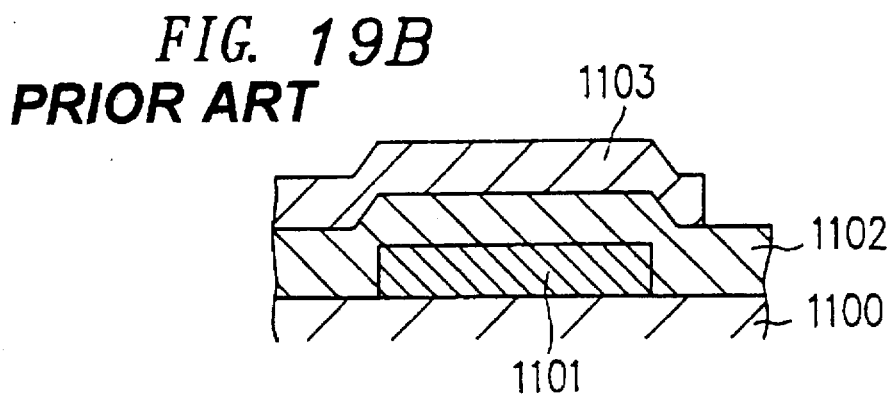
Figure 19C:
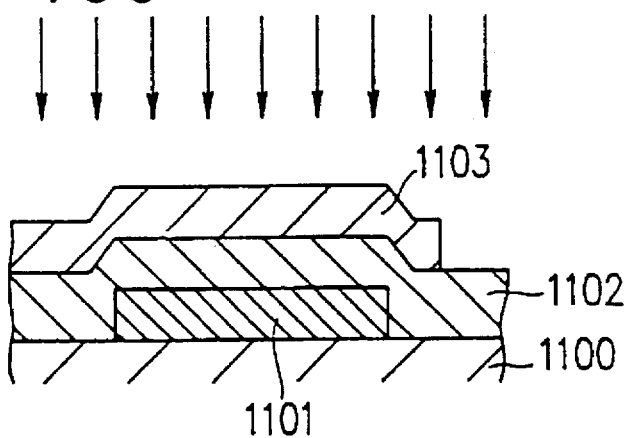
Figure 19D:
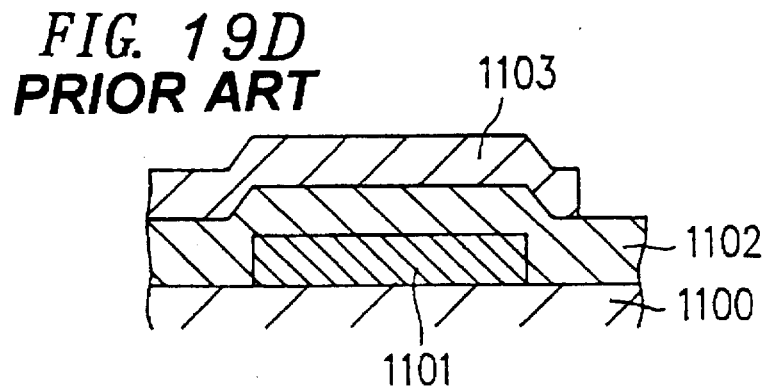
Figure 20A:
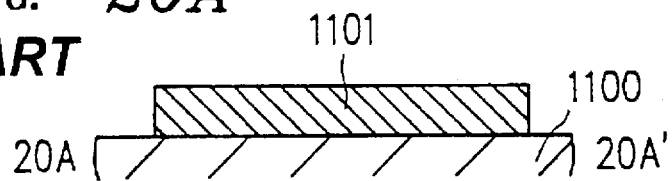
FIGS. 20A through 20D are cross-sectional views showing a fabrication process of the conventional TFT, taken along a line 20A-20A' (dashed line) in FIG. 18A.
Figure 20B:
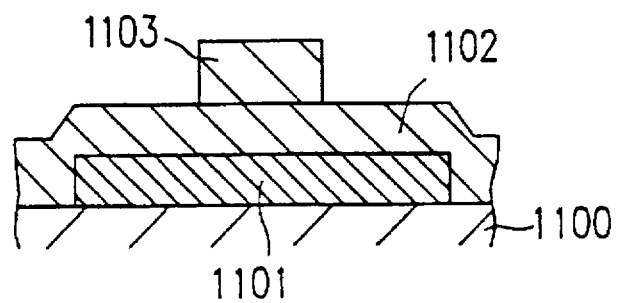
Figure 20C:
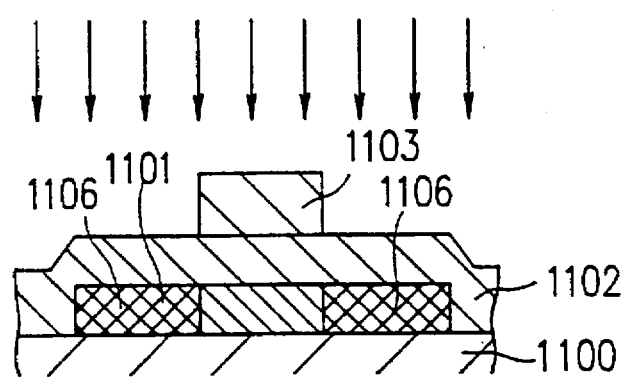
Figure 20D:
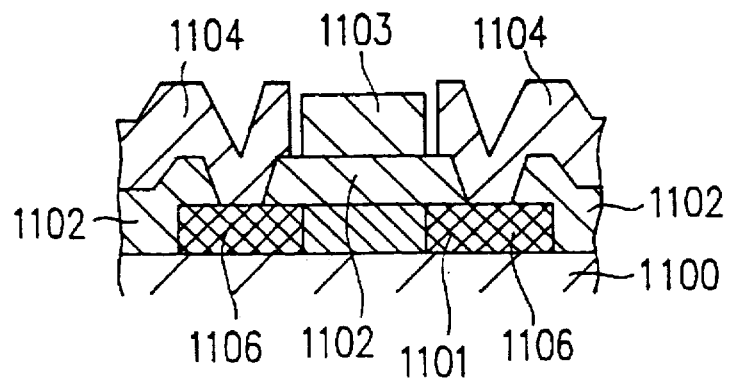

Next, as shown in FIGS. 16B and 17B, the light transmitting insulating film 809 made of $SiO_2$, $SiN_x$ or the like is formed on the substrate 800 to a thickness of about 200 nm so as to cover the light shielding film 808. Subsequently, a semiconductor silicon film is deposited on the insulating film 809 to a thickness in the range of 10 nm to 200 nm, preferably, 30 nm to 100 nm by using a CVD apparatus or the like.

Then, the entire substrate is annealed at about 600° C. so as to crystallize the semiconductor silicon film. The semiconductor silicon film can be crystallized by being irradiated with a high-energy light beam such as an excimer laser instead of being annealed. After the semiconductor silicon film is crystallized, the semiconductor silicon film is patterned into an island shape so as to obtain the semiconductor island 801.

The patterning of the semiconductor island 801 can be conducted by forming a resist island on the semiconductor silicon film by photolithography and subsequently etching selectively the semiconductor silicon film with a method such as dry etching. Since the etching process does not include a step of oxidizing the silicon film, the unevenness as being produced in thermal oxidation is prevented from being formed on the edges of the semiconductor island 801.

Figure 16C:
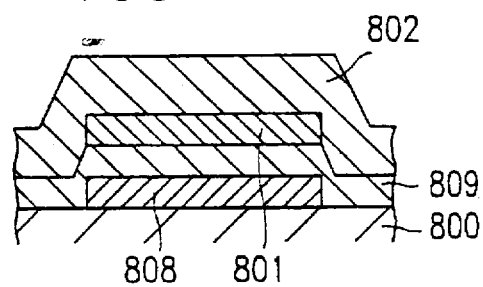
Figure 17C:
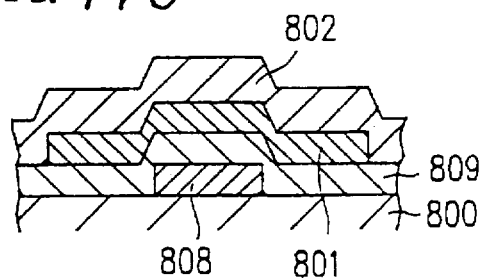

Next, as shown in FIGS. 16C and 17C, the gate insulating film 802 having a thickness of about 200 nm are deposited onto the semiconductor island 801 in this order so as to cover the entire substrate. The gate insulating film 802 is deposited by sputtering or a CVD method.

Next, in the same method as shown in FIGS. 9D and 9E of Example 4, the entire substrate is covered with a negative type photoresist film. Then, the entire substrate is exposed to light from the bottom face of the substrate 800 using the light shielding film 808 as a mask. By over exposing the photoresist film, an opening similar to the channel region 818 of the semiconductor island 801 in shape and smaller than the channel region 818 of the semiconductor island 801 in size is formed through the resist film. The size of the opening can be controlled by varying the exposure time.

Figure 16D:
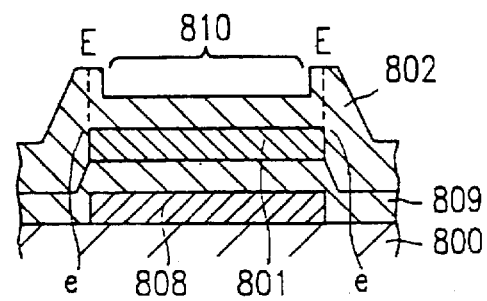
Figure 17D:
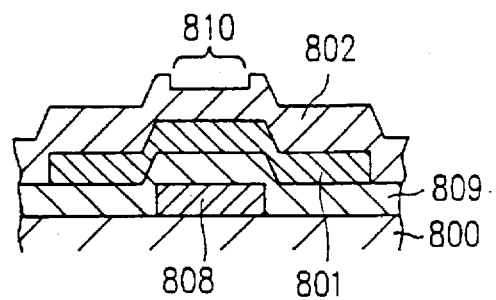

By selectively etching the upper part of the gate insulating layer 802 through the opening of the resist film, the concave portion 810 of the gate insulating layer 802 as shown in FIGS. 16D and 17D is formed. The concave portion 810 of the gate insulating layer 802 is positioned inside the positions of the edges E defined by projecting the edges e of the semiconductor island 801 on the surface of the gate insulating layer 802 in a direction perpendicular to the surface of the substrate 800.

Figure 16E:
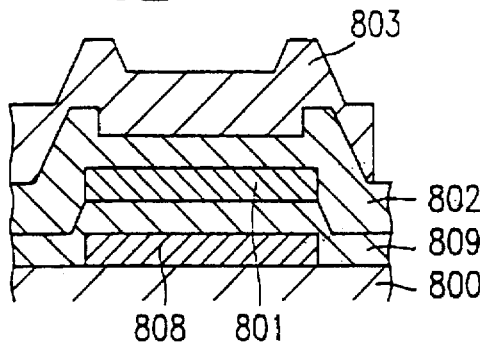
Figure 17E:
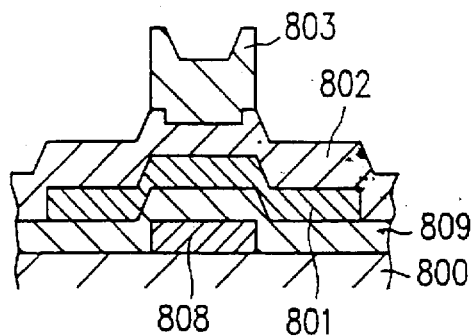

Next, as shown in FIGS. 16E and 17E, the gate electrode 803 is formed using a conductive material.

Figure 16F:
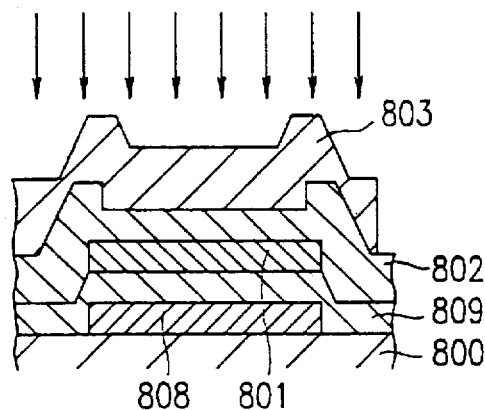
Figure 16G:
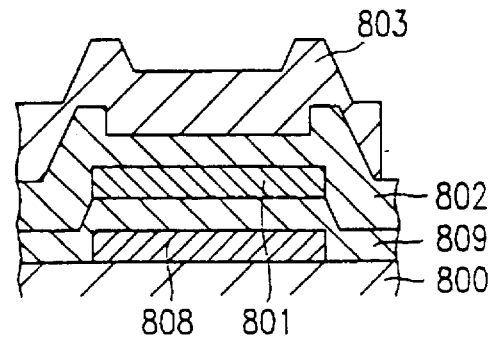
Figure 17F:
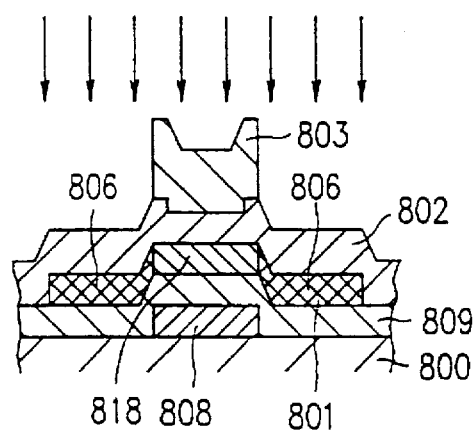

Then, as indicated with arrows in FIGS. 16F and 17F, donor ions or acceptor ions are implanted into the semiconductor island 801 by ion doping. Thereafter, by activating the dopant, regions of the semiconductor island 801 which do not overlap the gate electrode 803 are rendered electrically conductive so as to form the source/drain regions 805. A region of the semiconductor island 801 between the source region 806 and the drain region 806 serves as a channel region.

Figure 17G:
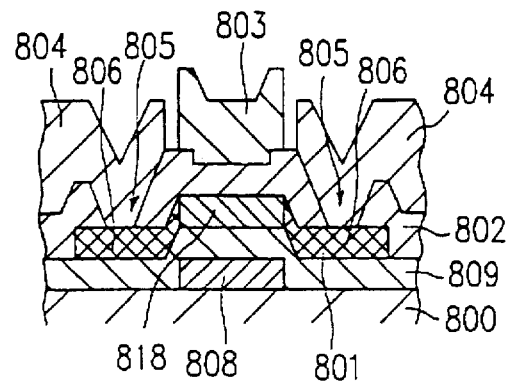

Finally, as shown in FIG. 17G, the contact holes 805 are formed through the insulating layer 802 on the source/drain regions 806. Then, the source/drain electrodes 804 on the regions which do not overlap the gate electrode 803 are formed so as to be electrically conductive with the source/drain regions 806 through the contact holes 805, thereby completing a TFT.

According to the present invention, a thickness of the gate insulating film in the vicinity of the edges of the semiconductor island can be made thicker than that of the gate insulating film On the central portion of the semiconductor island. More specifically, a distance between the edges of the semiconductor island and the gate electrode can be made greater than that between the central portion of the semiconductor island and the gate electrode. By this configuration, the increase in an OFF current and the concentration of the electric field which may deteriorate the TFT characteristics can be prevented from occurring. As a result, a TFT having excellent characteristics can be fabricated.

According to another aspect of the present invention, since the semiconductor island is formed without the oxidization process of the entire semiconductor film as performed in the method described in Japanese Laid-Open Patent Publication No. 6-37317; the unevenness is prevented from being formed on the edges of the semiconductor island, Therefore, it is possible to mass produce crystalline silicon TFTs utilizing substrates such as glass substrates.

According to still another aspect of the present inventions since the mask for photolithography which is used for patterning the semiconductor silicon island can be reused for forming the mask for lift-off, the TFT according to the present invention can be fabricated by using the same number of masks as those used for fabricating the TFT in a conventional method.

According to still another aspect of the present invention, since the light shielding film is provided below the semiconductor island, the TFT characteristics can be prevented from being deteriorated by light irradiation from the bottom face of the substrate. Since the light shielding film is used as a mask and the concave portion of the gate insulating film is formed by utilizing self-alignment, a TFT with higher precision can be obtained. According to still another aspect of the present invention, since the semiconductor island can be formed using a light shielding film as a mask by utilizing self-alignment, a TFT with higher precision can be obtained.

According to still another aspect of the present invention, the thickness of the gate insulating film in the vicinity of the channel region can be increased, the effect of concentration of the electric field at the drain end can be reduced. Furthermore, the phenomena related to the electric field strength, for example, the implantation of unnecessary electric charges into the insulator, are reduced. As a result, the reliability of TFTs can be improved as well as a leak current can be reduced.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A semiconductor device comprising a substrate having an insulating surface and a thin film transistor formed on the substrate, wherein the thin film transistor has a semiconductor island including a channel region and source/drain regions, a gate insulating film formed on the semiconductor island and a gate electrode covering the channel region of the semiconductor island interposing the gate insulating film therebetween, wherein the gate insulating film includes a first insulating film covering side faces and a whole upper face of the semiconductor island, and a second insulating film being formed on the first insulating film and having an opening positioned above the channel region, wherein the first insulating film is a continuous film, and wherein a distance between an edge of the semiconductor island in the channel region and the gate electrode is larger than a distance between a central portion of the channel region and the gate electrode.

2. A semiconductor device according to claim 1, wherein the substrate is a light transmitting substrate, and the semiconductor device further comprises a light shielding film for preventing light Incident on a bottom face of the light transmitting substrate from passing therethrough to reach the semiconductor island.

3. A semiconductor device according to claim 2, wherein the light shielding film is placed between the semiconductor island and the light transmitting substrate.

4. A semiconductor device according to claim 3, wherein the light shielding film has a shape identical with that of the semiconductor island, and is formed within a region defined by vertically projecting the semiconductor island onto the surface of the light transmitting substrate.

5. A semiconductor device according to claim 3, wherein the light shielding film has a shape identical with that of the channel region of the semiconductor island, and is formed within a region defined by vertically projecting the channel region onto the surface of the light transmitting substrate.

6. A semiconductor device according to claim 1 further comprising at least one insulating layer formed between the first insulating film and the second insulating film.

7. A semiconductor device according to claim 2 further comprising at least one insulating layer formed between the first insulating film and the second insulating film.

* * * * *